United States Patent [19]

Tohyama et al.

[11] Patent Number: 5,642,371

[45] Date of Patent: Jun. 24, 1997

[54] OPTICAL TRANSMISSION APPARATUS

[75] Inventors: Masaki Tohyama, Souka; Nobuo Suzuki, Tokyo, both of Japan

[73] Assignee: Kabushiki Kaisha Toshiba, Kawasaki, Japan

[21] Appl. No.: 208,704

[22] Filed: Mar. 11, 1994

[30] Foreign Application Priority Data

| Mar. 12, 1993 | [JP] | Japan | 5-052756 |
| Aug. 24, 1993 | [JP] | Japan | 5-209589 |
| Sep. 16, 1993 | [JP] | Japan | 5-229911 |

[51] Int. Cl.$^6$ ......................................... H01S 3/18
[52] U.S. Cl. .................. 372/45; 372/20; 372/23; 372/50; 372/46; 372/96
[58] Field of Search .......................... 372/96, 20, 26, 372/32, 50, 46, 45, 25, 43; 359/191

[56] References Cited

U.S. PATENT DOCUMENTS

| 4,932,034 | 6/1990 | Usami et al. | 372/96 |
| 4,995,048 | 2/1991 | Kuindersma et al. | 372/96 |
| 5,073,805 | 12/1991 | Nomura et al. | 372/43 |
| 5,170,402 | 12/1992 | Ogita et al. | 372/20 |
| 5,185,643 | 2/1993 | Vry et al. | 372/32 |
| 5,325,392 | 6/1994 | Tohmori et al. | 372/96 |
| 5,347,526 | 9/1994 | Suzuki et al. | 372/20 |

FOREIGN PATENT DOCUMENTS

| 56-112783 | 9/1981 | Japan | 372/96 |
| 59-103393 | 6/1984 | Japan | 372/96 |
| 0252681 | 11/1986 | Japan | 372/43 |
| 6097557 | 4/1994 | Japan | 372/20 |

OTHER PUBLICATIONS

Process Technology for Semiconductor Lasers: Crystal Growth and Microprocesses, Iga et al., Springer 1995, p. 13. (no month available).

Primary Examiner—Rodney B. Bovernick
Assistant Examiner—Yisun Song
Attorney, Agent, or Firm—Oblon, Spivak, McClelland, Maier & Neustadt, P.C.

[57] ABSTRACT

An optical transmission apparatus characterized by comprising a transmission system for transmitting an optical frequency-division multiplex signal, and an optical reception system which contains a semiconductor laser as a light source for reception and receives the optical signal, wherein the semiconductor laser contains first oscillation wavelength control device for controlling its oscillation wavelength according to temperature and second oscillation wavelength control device for controlling its oscillation wavelength according to carrier density, causes the first oscillation wavelength control device to scan oscillation wavelengths over a range from a first frequency to a second wavelength and simultaneously, causes the second oscillation wavelength control device to change the oscillation frequency, and selects wavelengths in the range from the first wavelength to the second wavelength stepwise sequentially.

18 Claims, 16 Drawing Sheets

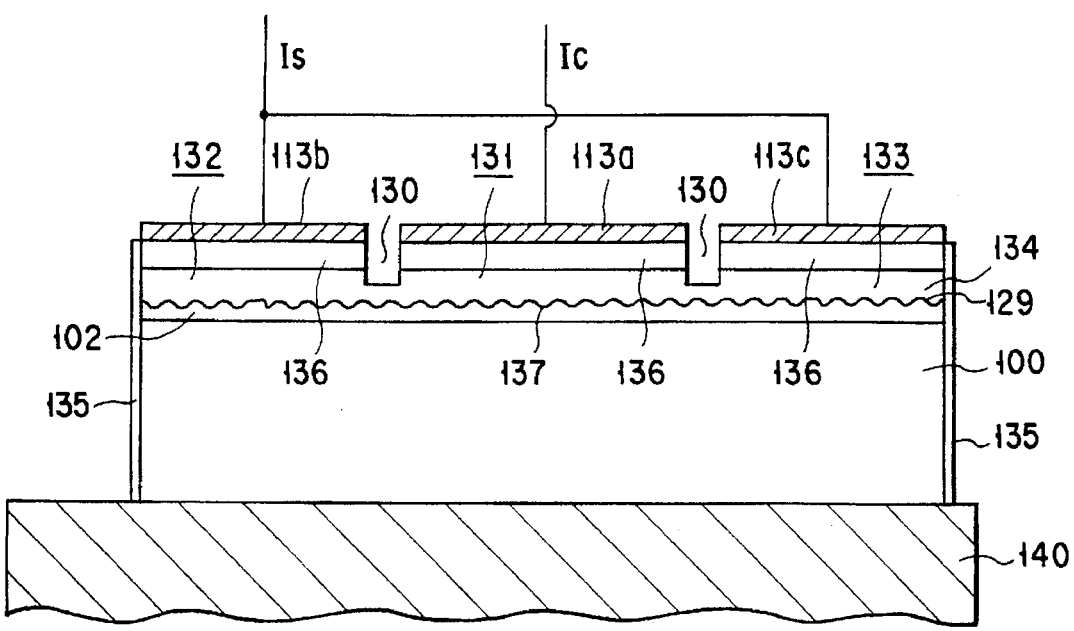
F I G. 1
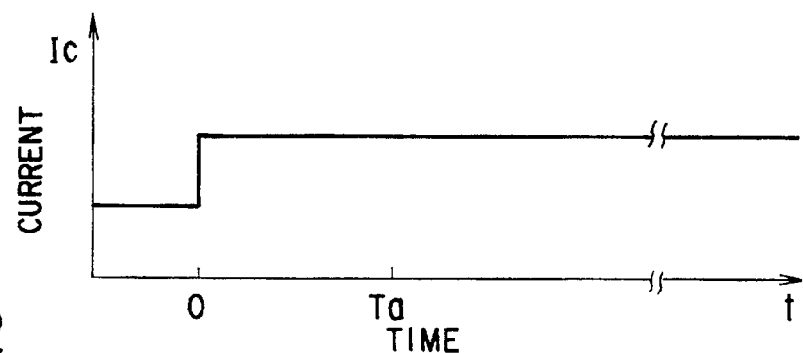
F I G. 2
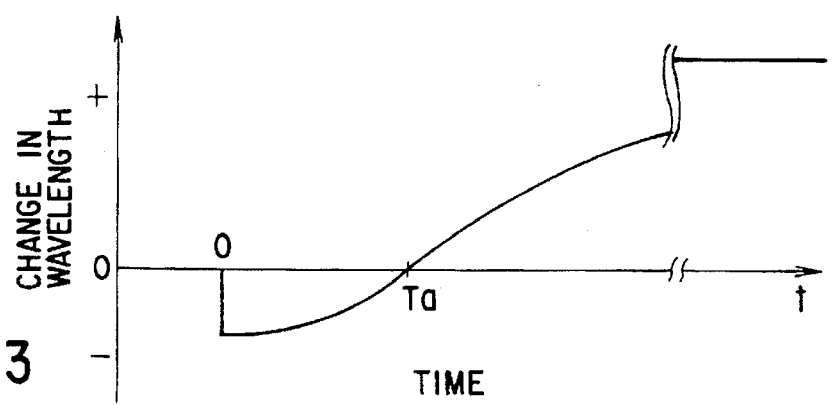
F I G. 3

FIG. 7a
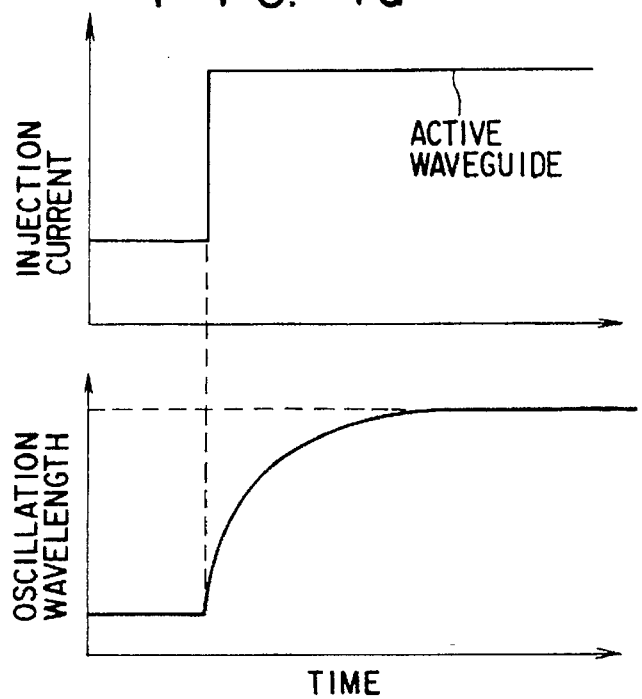
FIG. 7b
FIG. 8a
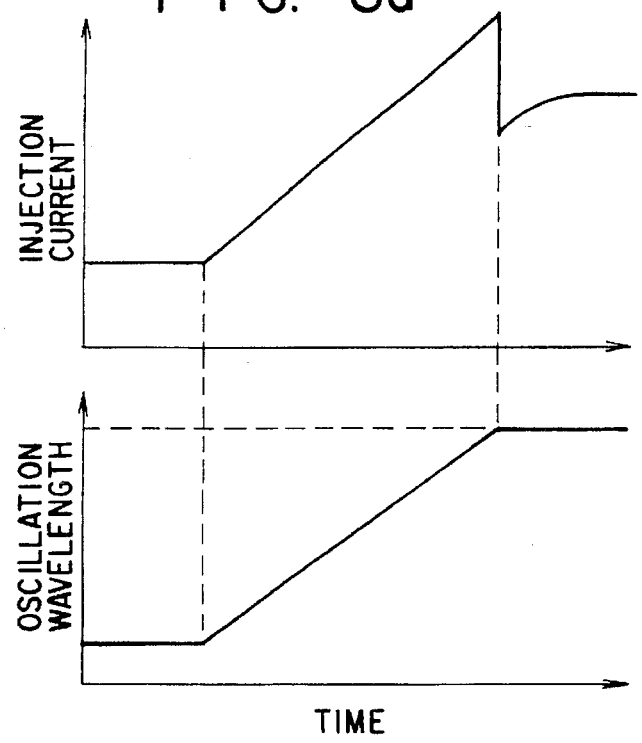
FIG. 8b

F I G. 9a
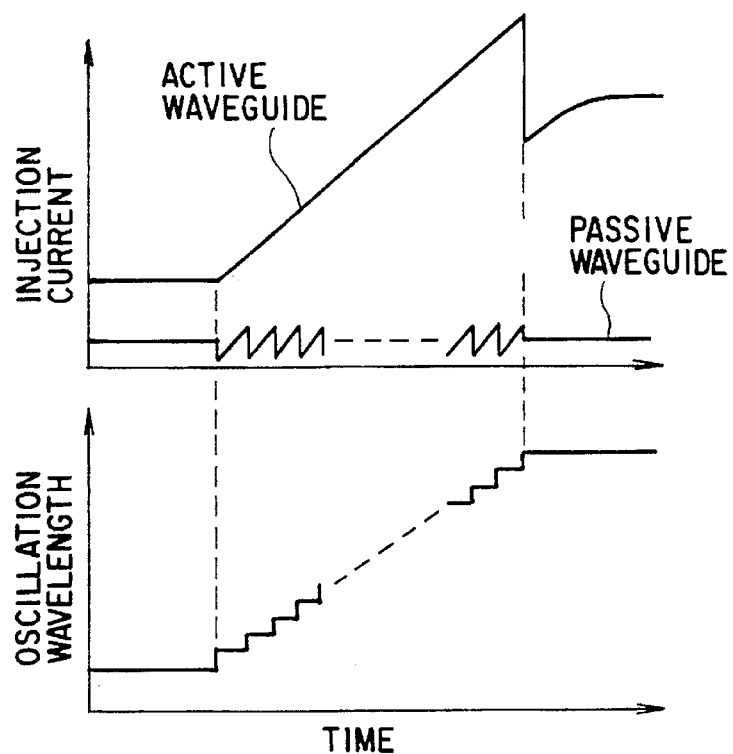
F I G. 9b
F I G. 10a
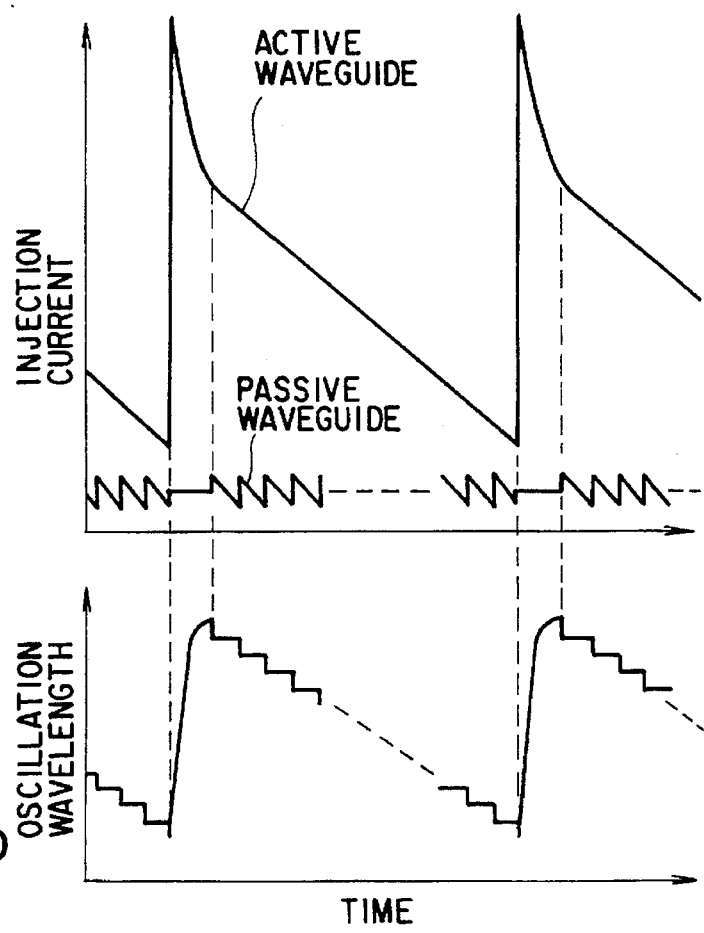
F I G. 10b

F I G. 12a
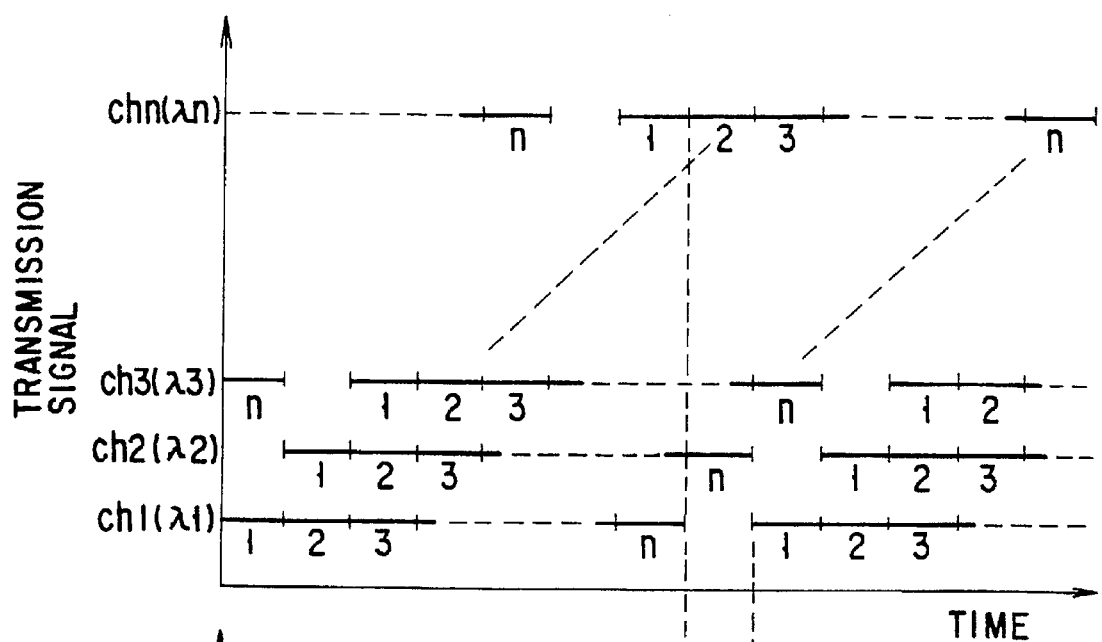
F I G. 12b
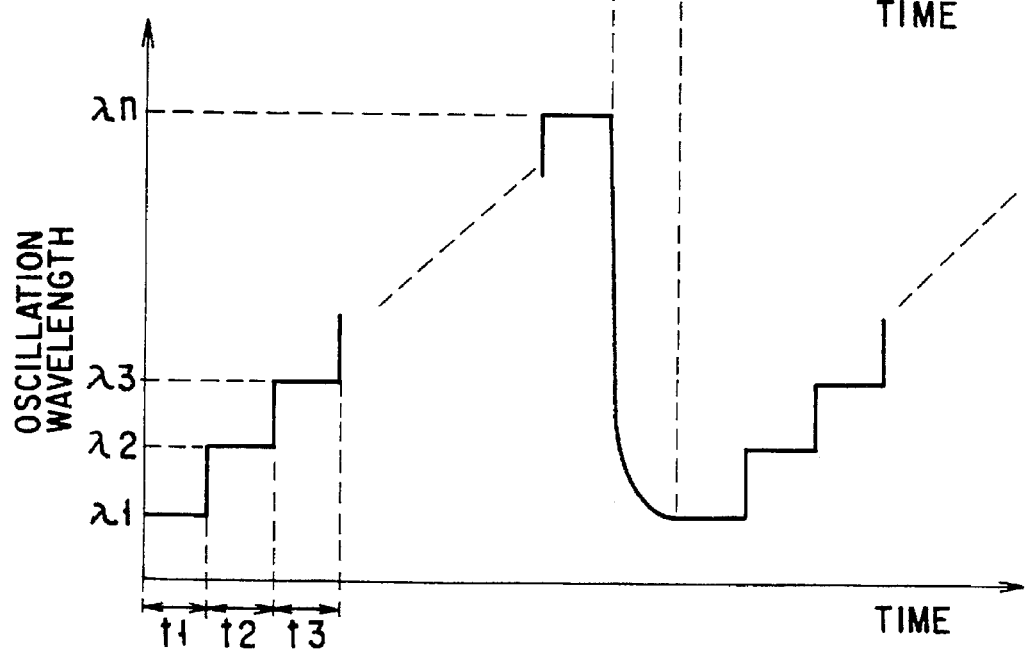

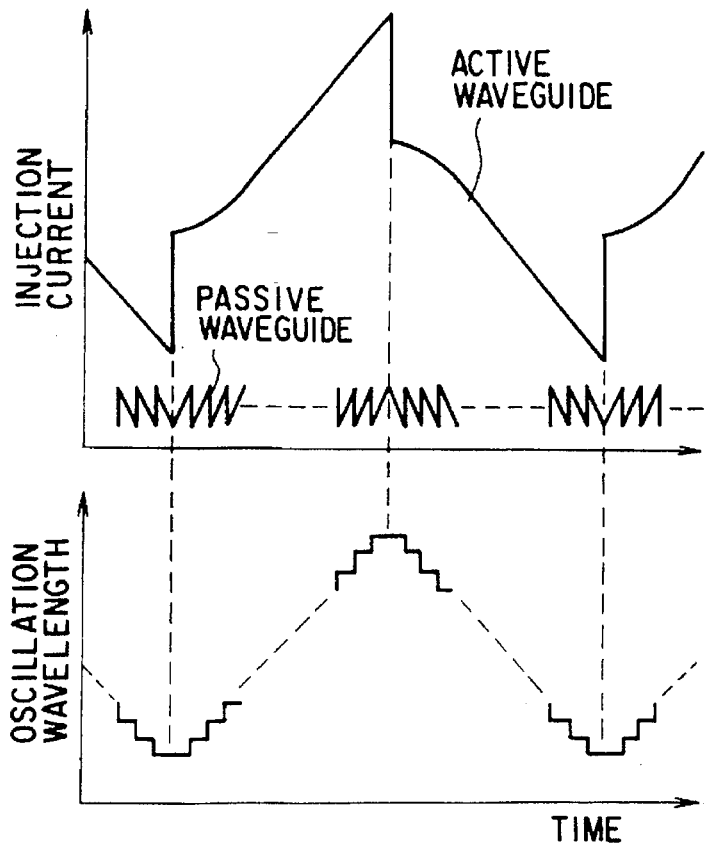
FIG. 13a
FIG. 13b
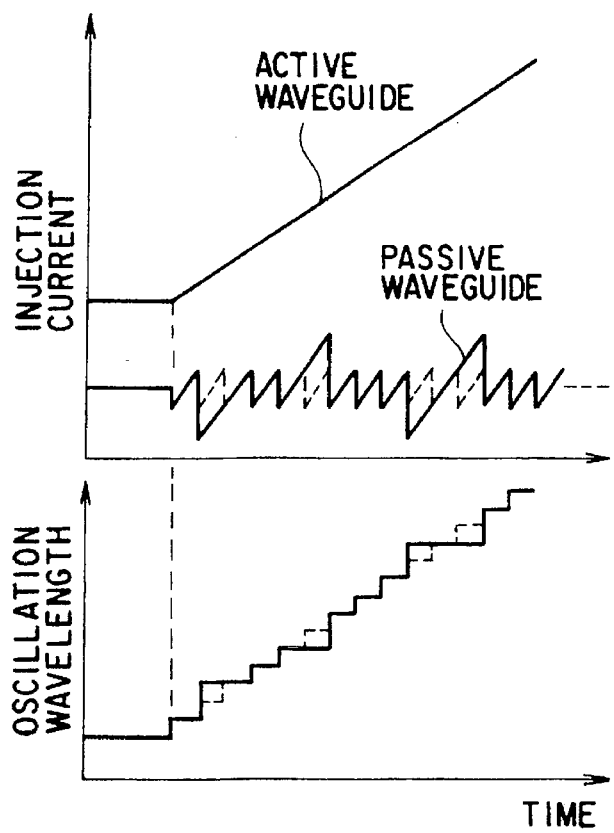
FIG. 14a
FIG. 14b

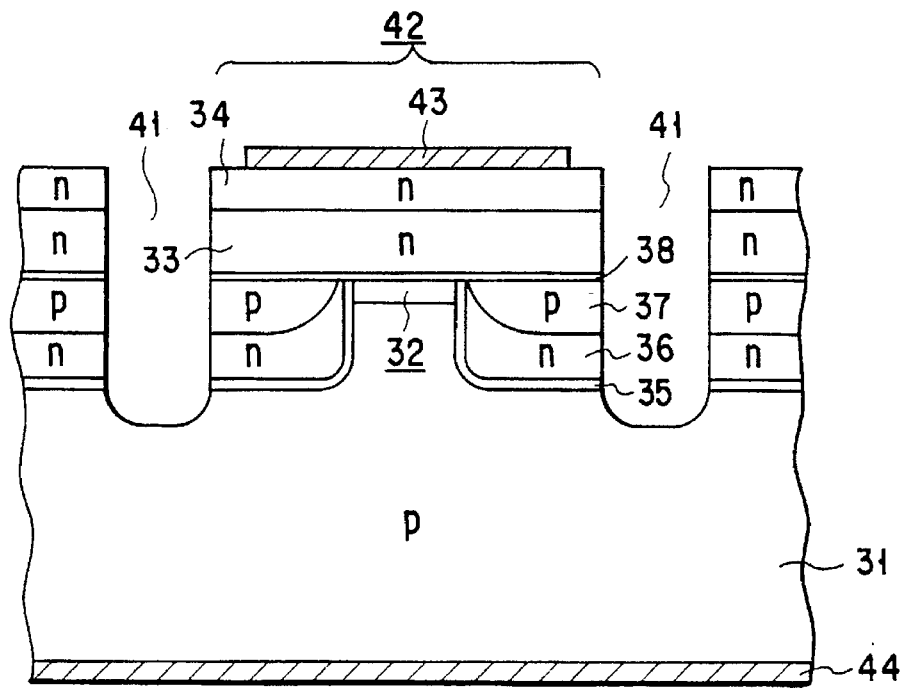
F I G. 17
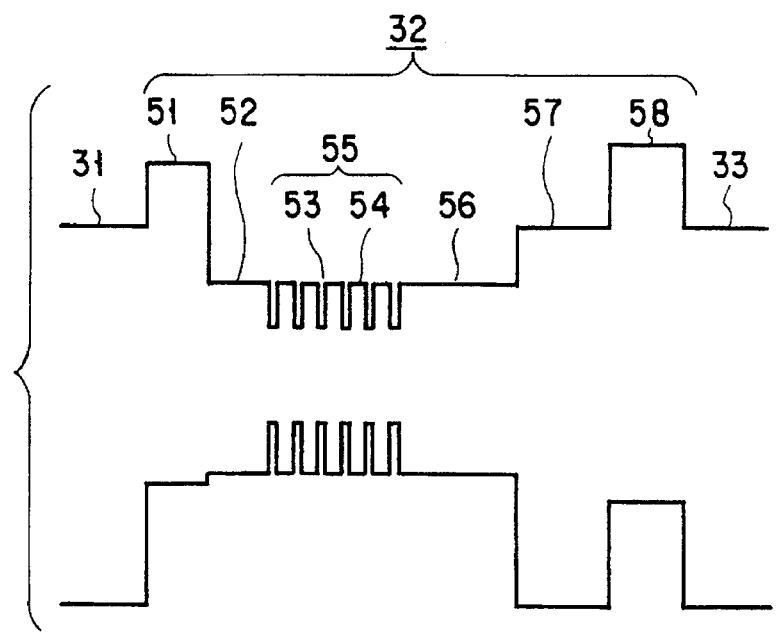
F I G. 18

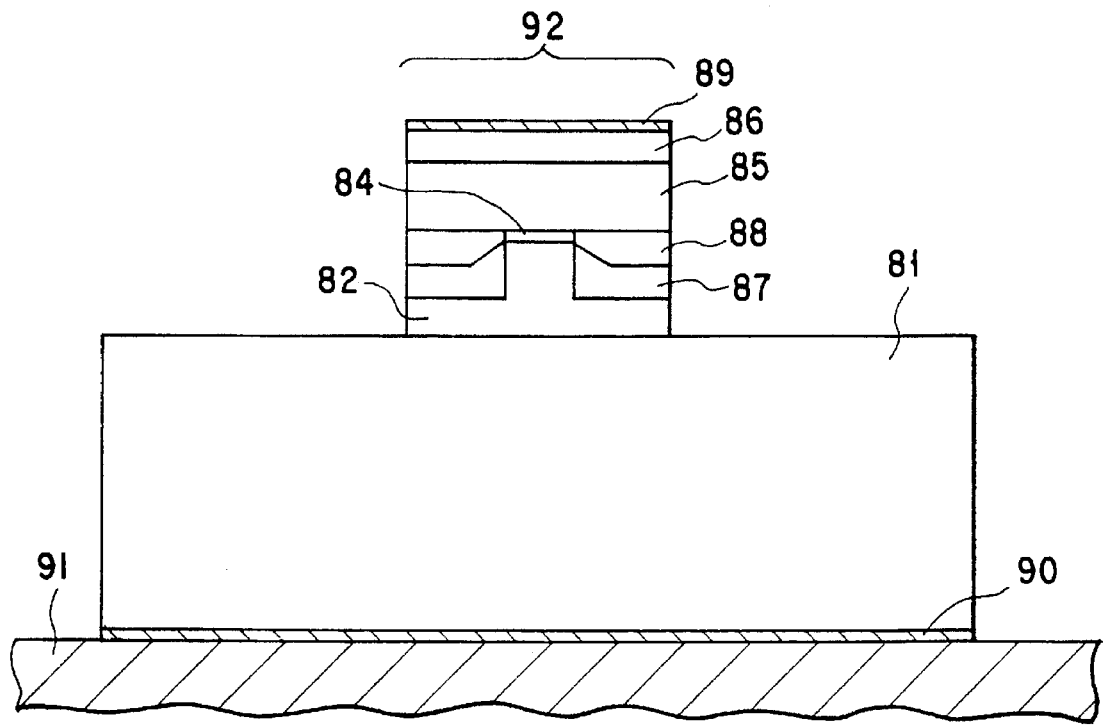
F I G. 25
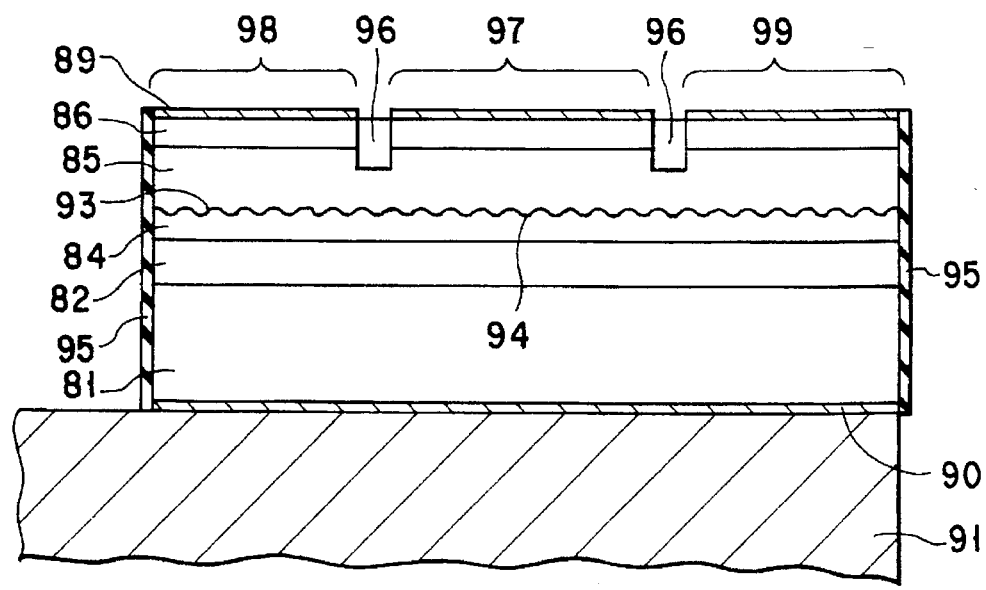
F I G. 26

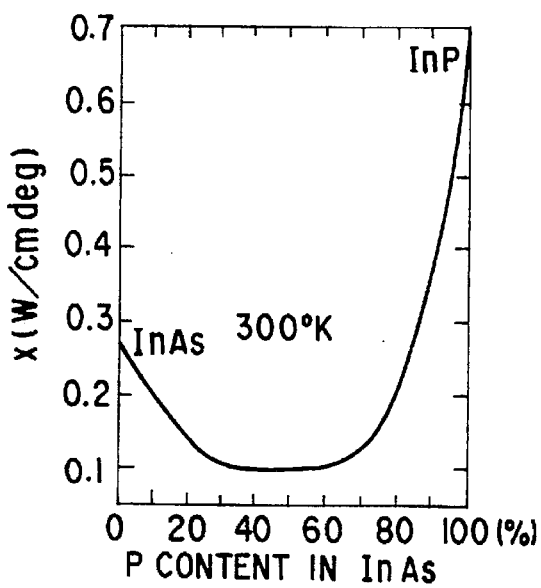
F I G. 27A
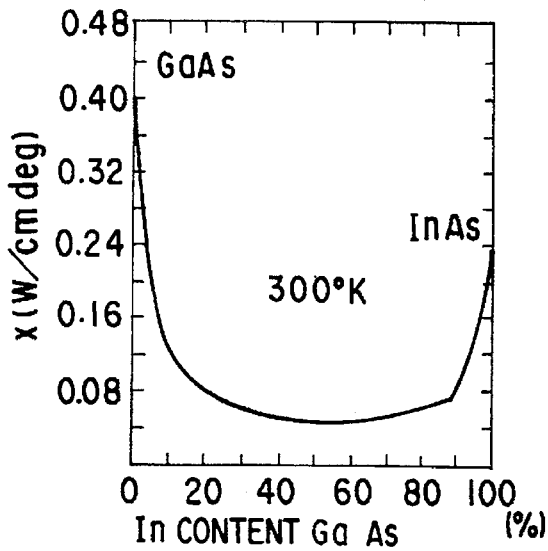
F I G. 27B
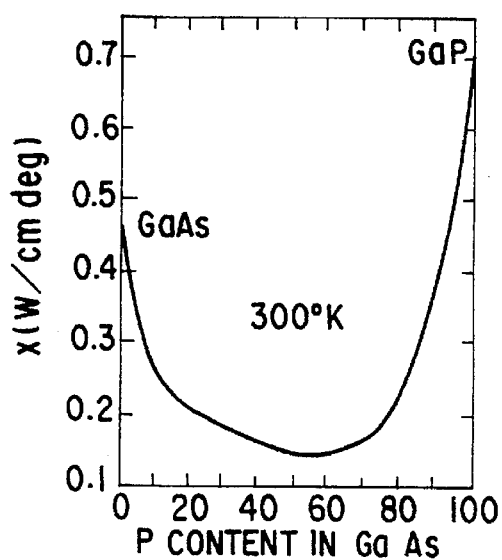
F I G. 27C

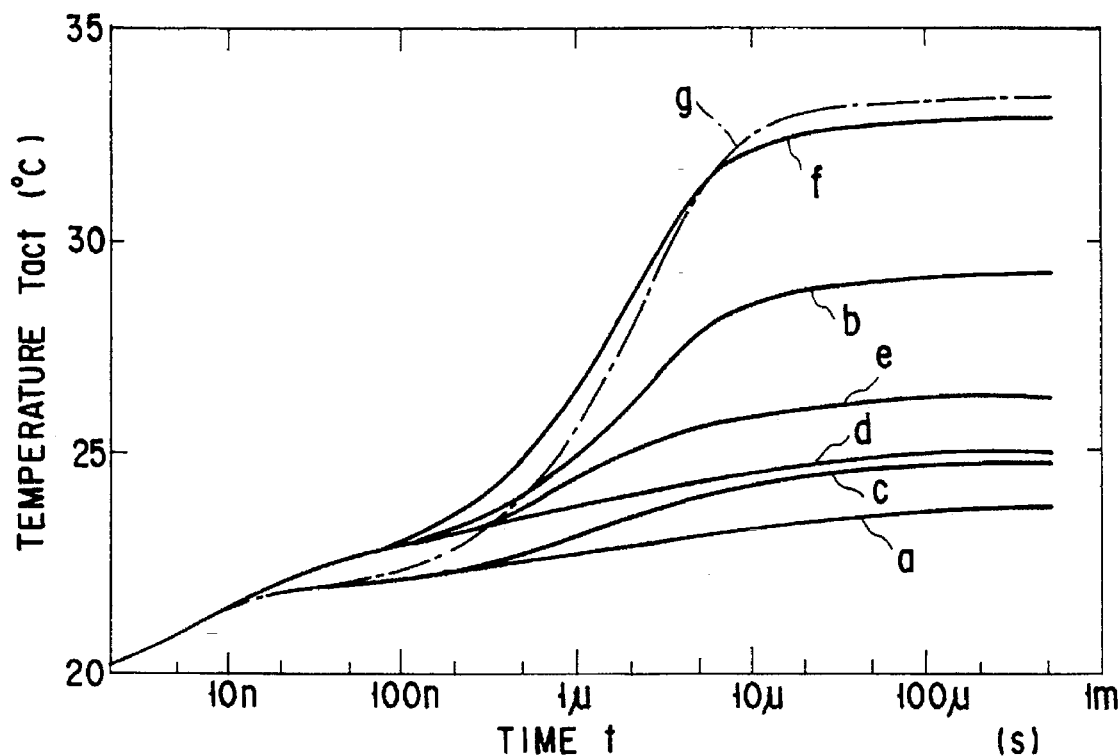
F I G. 28
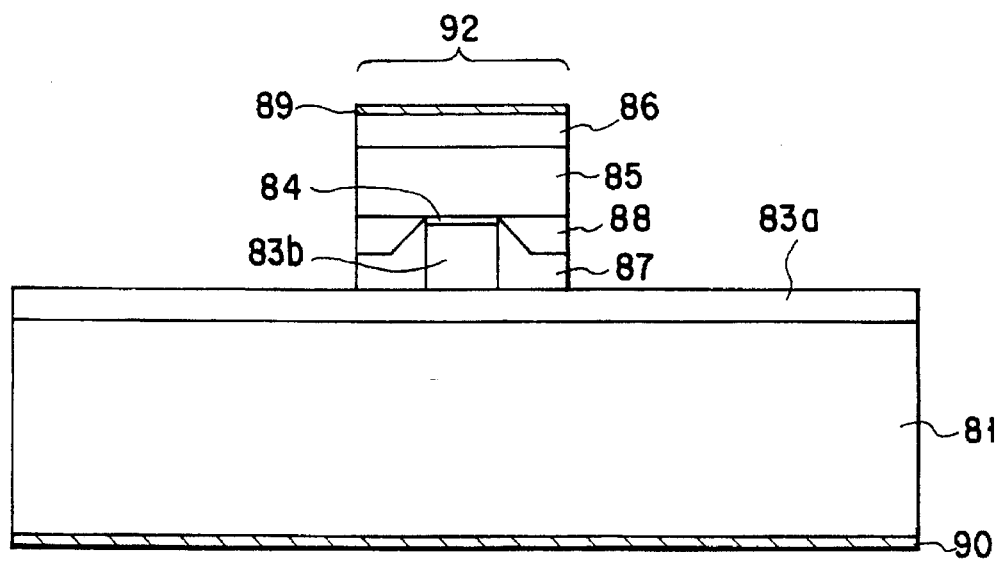
F I G. 29

OPTICAL TRANSMISSION APPARATUS

BACKGROUND OF THE INVENTION

1. Field of the Invention

This invention relates to an optical transmission apparatus in a communication system such as an optical frequency-division multiplex system (optical FDM), and a semiconductor laser device suitable for use in the optical transmission apparatus.

2. Description of the Related Art

Tremendous research and development efforts have been directed toward optical communication technology. The reason for this is that optical signal transmission is superior to electric signal transmission in transmission speed and interference between signals. With this backdrop, optical frequency-division multiplex systems (optical FDMs) today are attracting attention. The optical FDM is a communication system which enables a large capacity transmission through multiplexing in optical frequency space, and can be applied to various fields including optical interconnection, optical conversion, and optical arithmetic operation. Particularly, coherent optical communication using optical frequency and phase is capable of high-density frequency multiplexing, resulting in a remarkable increase in the amount of information transmitted. It therefore has a bright future as a next-generation communication system.

Coherent optical communication requires a light source which oscillates in a single longitudinal mode and has a narrow spectral line width. The optical FDM system, in addition to this, requires the light source to be tunable over a wide range of wavelengths. The tunable light source is used in selecting a channel on the reception side. The wider the range over which the light source is tunable, the more channels can be received. To construct an n-to-n optical communication requires a short channel switching time.

For coherent light sources for optical FDM, a compact, reliable, electrically tunable semiconductor laser device is now being developed. To realize a large capacity optical FDM, it is necessary to develop a semiconductor laser device tunable over a wide wavelength range. In addition, to multiplex more and more frequency channels in a specific range of wavelengths, it is necessary to make narrower the frequency range occupied by each channel, i.e., to make the oscillation wavelength spectral width narrower. Especially, in the coherent optical transmission system promising in the field of optical FDM, a light source with a very narrow line width is needed to obtain a reception signal through interference between a signal light and a local oscillation light.

Tunable semiconductor laser devices now being researched are those in which an oscillation wavelength is controlled according to carrier density and temperature, and are classified into four categories:

(1) Multielectrode distributed Bragg-reflector (DBR) semiconductor laser device
(2) Twin guide semiconductor laser device
(3) Temperature-controlled semiconductor laser device
(4) Multielectrode distributed feedback (DFB) semiconductor laser device With the multielectrode DBR semiconductor laser device in item (1), the wavelength is changed by controlling the injection of current into the Bragg reflection region and the phase matching region and thereby changing the refractive index. Since the carrier density in the passive waveguide (the Bragg reflection region and the phase matching region) can be changed greatly by current injection, the carrier density contributes more to the change of the refractive index in the Bragg reflection region and phase matching region than the temperature. Since the change rate of carrier density is as fast as on the order of nanoseconds, it is possible to realize a short channel switching time using a multielectrode DBR laser.

However, as the amount of carriers injected into the passive waveguide grows larger, the absorption loss increases, with the result that the optical output decreases and at the same time, the spectral line width increases. Because of this, an optical transmission apparatus using a multielectrode DBR laser has a problem: the variable wavelength changing range in which the spectral line width can be kept narrow is smaller.

The twin guide semiconductor laser device in item (2) independently controls a current flowing in an active layer and that flowing in an optical waveguide layer closely stacked with each other. It can be considered to have a region divided in the layer direction instead of the axis direction in a multielectrode DBR semiconductor laser device. Thus, it operates in a similar mode to the multielectrode DBR semiconductor laser device. However, because of the limitation of the oscillation spectral line width, it is difficult to apply the twin guide laser device to coherent optical transmission.

The temperature-controlled semiconductor laser device in item (3) has heating means in the vicinity of the active region to raise the temperature of the active layer. Generally, by raising the temperature of the active layer, the oscillation wavelength can be shifted so as to be longer (red shift), and therefore be changed greatly with the line width kept narrow. However, since a great change of the oscillation wavelength makes the time required for the oscillation wavelength to be stable as long as several milliseconds, it is difficult to apply the device to applications where optical FDM channels are switched at high speeds, such as optical LANs.

The multielectrode distributed feedback semiconductor laser device in item (4) is such that a DFB semiconductor laser device is divided into regions in the direction of the resonator, and the carrier density distribution and the temperature distribution are changed to vary the oscillation wavelength.

FIG. 1 shows a schematic structure of a three-electrode DFB semiconductor laser device as an example of a multielectrode DFB semiconductor laser device.

In the figure, numeral 100 indicates a p-type semiconductor substrate. On the p-type semiconductor substrate 100, an optical waveguide layer composed of an active layer 102 and a diffraction grating 129 is formed. On the optical waveguide layer, an n-type cladding layer 134 and an n-type ohmic contact layer 136 are formed in sequence.

The n-type cladding layer 134 and n-type ohmic contact layer 136 are divided by two grooves 130 into three current injection regions 131, 132, 133. These three current injection regions 131, 132, 133 are provided with electrodes 113a, 113b, 113c, respectively.

In the center of the diffraction grating 129, a phase shift region 137 is formed. In order that end reflection should have no effect in phase on the diffraction grating 129, antireflection coating films 135 are formed on both ends.

The laser body thus constructed is mounded on a heat sink 140 controlled at a constant temperature by a temperature sensor and a Peltier element.

In the three-electrode DFB semiconductor laser device, a case will be considered where a current Is flowing in the electrodes 113b, 113c provided on the current injection regions on both ends and a current Ic flowing in the electrode 113a provided on the current injection region 131 in the center are increased so as to balance with each other to maintain a single-mode oscillation state.

Since the temperature near the active layer 102 rises as the current increases, a red shift of several nanometers can be caused to take place. Because the entire area is an active region, fluctuations in the carrier density at the time of current injection are small, making the line width narrow. However, as it stands now, the response speed of thermal effects is slow, with the result that high-speed wavelength switching as required for optical LANs is difficult.

In addition to thermal effects, carrier effects contribute to the change of wavelength in the multielectrode DFB semiconductor laser device. An increase in the carrier density resulting from an increase in the current causes the refractive index to decrease, leading to a blue shift of oscillation wavelength. Although the response speed of carrier effects is several nanoseconds, a change in the carrier density in the active layer in an oscillating state is so small that the carrier effects alone generally can change the oscillation wavelength as much as 2 nanometers at most. It is well known that the sign of carrier effects is opposite to that of thermal effects and they differ greatly in response speed. These things have been described in, e.g., J. Jacquet et al., "Thermal contribution to wavelength tunability of multielectrode DFB layers," Technical Digest, Optical Fiber Communication (OFC) 91, paper FB4, p. 204.

In the multielectrode DFB semiconductor laser device, a red shift of carrier effects can be effected by suitably setting a bias and other factors. In this case, however, it is impossible to make the absolute value of a wavelength change large. This relationship between carrier effects and thermal effects makes it very difficult to switch wavelengths at high speeds.

This problem will be explained using FIGS. 2 and 3. FIG. 2 illustrates how current Ic flowing in electrode 113a changes with time in the three-electrode DFB semiconductor laser device of FIG. 1. FIG. 3 shows how the oscillation wavelength changes at that time.

Now, it is assumed that at time 0, current Ic is increased substantially and a red shift as great as several nanometers is achieved. Since the response speed of an increase in the carrier density in the active layer 102 resulting from an increase in Ic current is on the order of nanoseconds, the oscillation wavelength makes a blue shift immediately as shown in FIG. 3.

Although most of the input energy resulting from the current increase at the p-n junction in the active layer 102 is spent on the increase of optical energy, part of the energy is converted into heat as a result of an increase in the nonluminescent recombination current. In addition, the increase of current Ic causes an increase in the amount of heat generated by the contact resistance of electrode 113a, and an increase in the amount of heat generated by the resistive component between the ohmic contact layer 136 and the active layer 102. As a result, the temperature of the thermally active layer 102 rises gradually as time passes, which allows the oscillation wavelength to make a red shift as shown in FIG. 3.

Since thermal effects are generally greater than carrier effects, the oscillation wavelength becomes equal to the original oscillation wavelength at time Ta after current Ic has been increased, as shown in FIG. 3. Since then, the red shift further continues. The temperature of the active layer 102 finally becomes stable at an equilibrium temperature determined by the heat generating state and the heat sink temperature. The time required for the temperature to be stable is several milliseconds.

To shorten this time, feedback control is applied to the three-electrode DFB semiconductor laser device of FIG. 1 as shown in FIG. 4.

The laser light 137 emitted from the three-electrode DFB semiconductor laser device passes through a lens system 141 and an optical isolator 142, and enters a beam splitter 143. The beam splitter 143 splits nearly 10% of the optical power to supply it to a Mach-Zehnder interferometer 144 acting as a frequency discriminator, and directs the remaining optical power to an emission fiber pigtail 149. The Mach-Zehnder interferometer 144 outputs a signal of a level proportional to the change of wavelength. The level is sensed by a photodiode 145, and is used by a wavelength controller 146 as an error signal for control of Ic. Here, the time constant of the parts excluding the laser in the feedback system is shorter than the response time of thermal effects.

Now, it is assumed that a reference signal is externally supplied to the wavelength controller 146 to change the reference value at the wavelength controller 146, thereby making a red shift of oscillation wavelength. The wavelength controller 146 controls current Ic so that the difference ($\lambda_{ref}-\lambda_0$) between the wavelength $\lambda_{ref}$ corresponding to the new reference value and the current wavelength $\lambda_0$ may be smaller. Namely, the wavelength controller 146 increases current Ic so that wavelength $\lambda_0$ may be larger.

At this time, because the oscillation wavelength first undergoes a blue shift due to carrier effects, the wavelength $\lambda_0$ becomes not larger but smaller. Consequently, the error signal increases and the wavelength controller 146 tends to increase current Ic further.

In this way, the wavelength controller 146 based on thermal effects continues increasing current Ic. In the meantime, when the error signal has begun to decrease due to thermal effects, the wavelength controller 146 begins to decrease current Ic to the contrary. However, a decrease in Ic results in a red shift momentarily, giving rise to an excessive response.

As a result, ordinary PID control cannot control the oscillation wavelength successfully, and it is difficult to stabilize the oscillation wavelength to a specified value in a short time. Particularly, a momentary response is of the opposite phase, so that differential control cannot be effected properly. For this reason, a complicated feedback system is required.

At any rate, since a wavelength that can be shifted only by carrier effects is smaller than that by thermal effects, slow-response thermal effects alone can change the wavelength greatly. That is, the time constant of the feedback system is limited by the response time of slow thermal effects.

FIG. 5 shows a schematic structure of another example of the three-electrode DFB semiconductor laser device.

In the figure, numeral 151 indicates an n-type InP substrate. On the n-type InP substrate 151, an n-type InP cladding layer 153 is formed. On top of a narrowed portion of the n-type InP cladding layer 153, a striped strained quantum well active/optical waveguide layer 154 of approximately 1 μm width is formed. The narrowed portion of the n-type InP cladding layer 153 is buried with a p-type InP layer 157 and an n-type InP layer 158.

On the strained quantum well active/optical waveguide layer 154, a p-type InP cladding layer 155 and a p-type ohmic contact layer 156 are formed in sequence. The p-type InP cladding layer 156 is provided with a p-side ohmic electrode 159, whereas the n-type InP substrate 151 is provided with an n-side ohmic electrode 160.

Although not shown in the figure, the p-type InGaAsP ohmic contact layer 156 and the p-side ohmic electrode 159 are divided into three pieces, a central region and regions on both ends, in each of which current is allowed to flow independently. Furthermore, a single-mode DFB oscillation is realized by a first-order diffraction grating (not shown) formed on the strained quantum well active/optical waveguide layer 154.

With the three-electrode DFB semiconductor laser device thus constructed, when currents flowing in the three regions are increased in a balanced manner so as to maintain a single-mode oscillating state, the temperature near the strained quantum well active/optical waveguide layer 154 rises. This therefore causes a red shift of several nanometers. In addition, because all the regions are active, fluctuations in the carrier density at the time of current injection are small, consequently making the line width narrow.

However, as it stands now, when the semiconductor laser device is applied to an optical FDM system where many wavelength channels are switched at high speeds, this results in a very inefficient system because the response speed of thermal effects is slow and therefore it takes a long time to switch wavelengths.

As mentioned above, a conventional optical apparatus using a conventional multielectrode DFB semiconductor laser has a problem: although the spectral line width can be kept narrow over a wide wavelength changing range, it takes a long time to switch channels.

Additionally, an optical transmission apparatus using a conventional multielectrode DBR semiconductor laser has a problem: although the channel switching time is short, the wavelength changing range over which the spectral line width can be kept narrow is narrow.

SUMMARY OF THE INVENTION

Accordingly, an object of the present invention is to provide an optical transmission apparatus capable of achieving a short channel switching time, while maintaining a narrow spectral line width over a wide range.

Another object of the present invention is to provide a semiconductor laser device capable of changing an oscillation wavelength greatly at high speeds.

Still another object of the present invention is to provide a semiconductor laser device which can be used as a coherent light source suitable for optical FDM.

The foregoing objects are accomplished by providing an optical transmission apparatus comprising: a transmission system for transmitting an optical signal; and an optical reception system which contains a semiconductor laser as a local oscillation light source for reception and receives the optical signal; wherein the semiconductor laser contains first oscillation wavelength control means for controlling its oscillation wavelength according to temperature and second oscillation wavelength control means for controlling its oscillation wavelength according to carrier density, causes the first oscillation wavelength control means to scan oscillation wavelengths over a range from a first frequency to a second wavelength and simultaneously, causes the second oscillation wavelength control means to change the oscillation frequency, and selects wavelengths in the range from the first wavelength to the second wavelength stepwise sequentially.

The foregoing objects are also accomplished by providing a semiconductor laser device comprising: a striped optical waveguide structure composed of an active layer acting as a light-emitting layer, a diffraction grating acting as a laser resonator provided in a waveguide of the laser light generated in the active layer, and a first barrier layer for adding energy to carriers injected into the active layer; a first and second cladding layers for sandwiching the optical waveguide structure; and a plurality of current injection regions arranged in the direction in which the laser light travels.

The foregoing objects are further accomplished by providing a semiconductor laser device comprising: a substrate; a first cladding layer in a projected shape provided on the substrate whose thermal conductivity is lower than that of the substrate; an active layer formed on the projected portion of the first cladding layer and acting as both a light-emitting layer and an optical waveguide layer; a second cladding layer provided on the active layer and, together with the first cladding layer, sandwiching the active layer; and a diffraction grating provided in a waveguide of the laser light generated in the active layer and acting as a distributed feedback resonator.

The foregoing objects are still further accomplished by providing a semiconductor laser device comprising: a substrate; a heat flow delay layer provided on the substrate whose thermal conductivity is lower than that of the substrate; a first cladding layer provided on the heat flow delay layer which has a greater thermal conductivity than the heat flow delay layer and a narrower width than the substrate; an active layer formed on the first cladding layer and acting as both a light-emitting layer and an optical waveguide layer; a second cladding layer provided on the active layer and, together with the first cladding layer, sandwiching the active layer; and a diffraction grating provided in a waveguide of the laser light generated in the active layer and acting as a distributed feedback resonator.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic sectional view of a conventional three-electrode DFB semiconductor laser device;

FIG. 2 is a graph of how the current flowing in the three-electrode DFB semiconductor laser device of FIG. 1 changes with time;

FIG. 3 is a graph of how the oscillation wavelength changes with time according to the current in FIG. 2;

FIG. 7 is a graph of the relationship between the injection current into the active region and the oscillation wavelength;

FIG. 8 is a graph of the relationship between the injection current into the active region and the oscillation wavelength;

FIG. 9 is a graph of the relationship between the injection currents into the active region and passive waveguide and the oscillation wavelength;

FIG. 10 is a graph of the relationship between the injection currents into the active region and passive waveguide and the oscillation wavelength;

FIG. 12 is a graph of the relationship between the transmission signal and the oscillation wavelength;

FIG. 13 is a graph of the relationship between the injection currents in the active region and passive waveguide and the oscillation wavelength;

FIG. 14 is a graph of the relationship between the injection currents into the active region and passive waveguide and the oscillation wavelength;

FIG. 17 is a sectional view taken along a plane parallel to the emission surface of the semiconductor laser chip of the three-electrode DFB semiconductor laser device of FIG. 16;

FIG. 18 is a band diagram of the vicinity of the active layer in the semiconductor laser chip of FIG. 17;

FIG. 25 is a sectional view taken in the direction perpendicular to the stripes of a three-electrode DFB semiconductor laser device according to a fifth embodiment of the present invention;

FIG. 26 is a sectional view taken in the direction parallel to the stripes of the three-electrode DFB semiconductor laser device of FIG. 25;

FIGS. 27A to 27C are graphs of the thermal conductivity of semiconductor mixed crystals in group III-V;

FIG. 28 is a graph to help explain the change of temperature in the active layer due to heat generation; and FIG. 29 is a sectional view taken in the direction perpendicular to the stripes of a three-electrode DFB semiconductor laser device according to a sixth embodiment of the present invention.

DETAILED DESCRIPTION OF THE PREFERRED EMBODIMENTS

Figure 4:
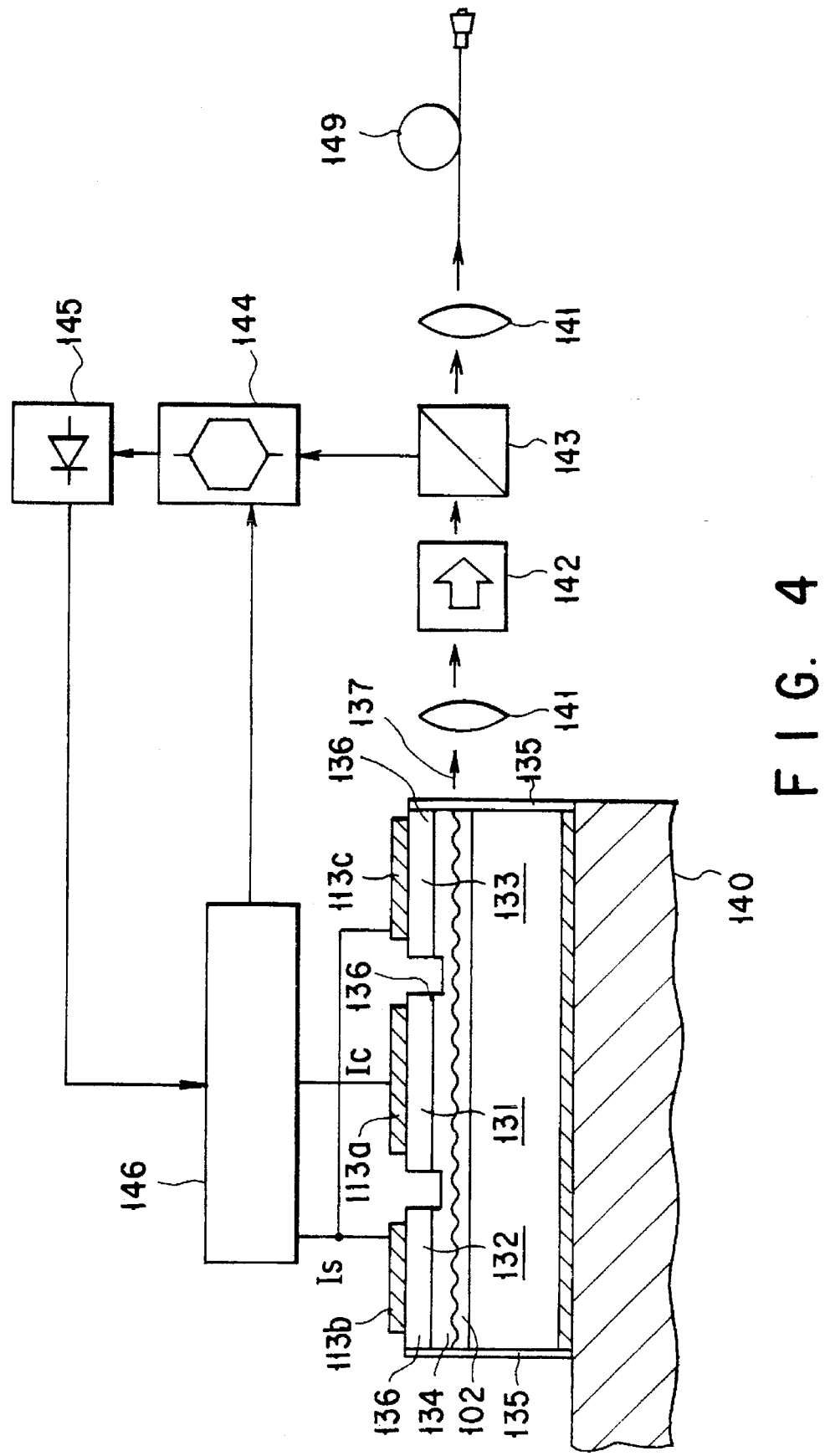
FIG. 4 is a schematic diagram of the three-electrode DFB semiconductor laser device of FIG. 1 to which wavelength feedback control is applied.

An optical transmission apparatus of the present invention comprises a transmission unit which transmits an optical signal and an optical reception unit which contains a semiconductor laser as a local oscillation light source for reception and receives an optical signal. The semiconductor laser contains first oscillation wavelength control means for controlling the oscillation wavelength by temperature and second oscillation wavelength control means for controlling the oscillation wavelength by carrier density. The semiconductor laser is characterized by causing the first oscillation wavelength control means to scan the oscillation wavelengths over a range from a first wavelength to a second wavelength and at the same time, causing the second oscillation wavelength control means to vary the oscillation frequency, and then selecting wavelengths stepwise one after another between the first wavelength and the second wavelength.

Here, the first oscillation wavelength control means for controlling the oscillation wavelength by temperature indicates current injection into an active waveguide region or built-in heating means (such as a thin-film resistance). In the case of current injection into the active waveguide region, since the change of carrier density takes place at the same time that the temperature changes, provision is made for the effect of temperature change to prevail.

Generally, for control of oscillation wavelength by temperature, the spectral line width can be kept narrow over a wider wavelength changing range, but it takes a longer time to switch oscillation wavelengths.

On the other hand, for control of oscillation wavelength by carrier density, it takes a shorter time to switch oscillation wavelengths, but a wavelength changing range in which the spectral line width can be kept narrow is smaller.

Accordingly, with the invention, the first oscillation wavelength control for controlling the oscillation wavelength according to temperature enables scanning over a wide wavelength range, while keeping the spectral line width narrow, and at the same time, the second oscillation wavelength control means for controlling the oscillation wavelength according to carrier density allows a desired wavelength to be selected from the wavelength range in a short time.

Consequently, according to an optical transmission apparatus using a semiconductor laser provided with the first and second oscillation wavelength control means, it is possible to realize a short channel switching time, while maintaining the narrow spectral line width over a wide range.

In the optical transmission apparatus of the invention, semiconductor lasers particularly suitable for the local oscillation light source for reception are as follows:

(1) A semiconductor laser device comprises: a striped optical waveguide structure containing an active layer serving as a light-emitting layer, a diffraction grating acting as a laser resonator provided in the waveguide for the laser light generated in the active layer, and a first barrier layer for amplifying the energy of carriers injected into the active layer; a first cladding layer and a second cladding layer sandwiching the optical waveguide structure; and a plurality of current injection regions arranged in the direction in which the laser light travels.

In the case of the semiconductor laser, since high-energy carriers are injected into the active layer, there is a possibility that an overflow of carriers will generate an overflow current noncontributory to laser oscillation. For this reason, it is desirable to provide a barrier layer between the active layer and the cladding layer to prevent carriers from overflowing.

With this semiconductor laser device, carriers are injected into the active layer, going over the barrier layer in the optical waveguide structure at the time of current injection. This causes carriers (hot carries) whose energy is as high as the barrier height of the barrier layer to be injected into the active layer.

Because the hot carriers injected into the active layer are converted into heat immediately, the temperature of the active layer rises immediately after the start of current injection. This makes the response speed of thermal effects faster, so that a red shift by the thermal effects of hot carriers exceeds a blue shift by the carrier effects in a short time.

Therefore, because the time constant of the feedback system is determined by high response-speed thermal effects, not by low response-speed thermal effects as in a conventional equivalent, it is possible to change the oscillation wavelength greatly at high speeds even by a simple feedback system.

(2) A semiconductor laser device characterized by comprising: a substrate; a first cladding layer in a projected shape which is provided on the substrate and whose thermal conductivity is lower than that of the substrate; an active layer provided on top of the projected portion of the first cladding layer and acting as both a light-emitting layer and an optical waveguide layer; a second cladding layer which is provided on the active layer and which, together with the first cladding layer, sandwiches the active layer, and a diffraction grating provided in a waveguide of the laser light generated in the active layer and acting as a distributed feedback resonator.

Here, if the thermal conductivity of the substrate is $K_s$ [W/(m·K)], the thermal conductivity of the first cladding layer is $K_1$ [W/(m·K)], the thickness of the first cladding layer is $d_1$ [m], the width of the second cladding layer is $w$ [m], and the height above the top of the first cladding layer is $h$ [m], it is desirable to fulfill the following expression:

$$C \cdot h < K_1/d_1 < K_s/(2w) \qquad (I)$$

where $C=1.5 \times 10^{11}$ [W/m³K].

In this semiconductor laser, since the thermal conductivity of the first cladding layer is lower than that of the substrate, when current is injected into the active layer and thus the active layer generates heat, the flowing of heat from the active layer to the substrate is blocked by the first cladding layer. This permits the heat accumulated in and above the first cladding layer to raise the temperature in the active layer. Because the active layer and the second cladding layer are thin, their heat capacity is small. Therefore, it is possible to change the temperature of the active layer and the oscillation wavelength greatly in a short time.

(3) A semiconductor laser device comprises: a substrate; a heat flow delay layer which is provided on the substrate and whose thermal conductivity is lower than that of the substrate; a first cladding layer which is provided on the heat flow delay layer, and which has a higher thermal conductivity than the heat flow delay layer and a narrower width than substrate; an active layer provided on top of the first cladding layer and acting as both a light-emitting layer and an optical waveguide layer, a second cladding layer which is provided on the active layer and which, together with the first cladding layer, sandwiches the active layer, and a diffraction grating provided in a waveguide of the laser light generated in the active layer and acting as a distributed feedback resonator.

Here, if the thermal conductivity of the substrate is $K_s$ [W/(m·K)], the thermal conductivity of the heat flow delay layer is $K_0$ [W/(m·K)], the thickness of the heat flow delay layer is $d_0$ [m], the width of the first cladding layer is $w$ [m], and the height above the top of the heat flow delay layer is $h$ [m], it is desirable to fulfill the following expression:

$$C \cdot h < K_0/d_0 < K_s/(2w) \qquad (II)$$

where $C=1.5 \times 10^{11}$ [W/m³K].

In this semiconductor laser, since the thermal conductivity of the heat flow layer is lower than that of the first cladding layer, when current is injected into the active layer, and thus the active layer generates heat, the flowing of heat from the active layer to the substrate is blocked by the heat delay layer. This permits the heat accumulated in the heat flow delay layer and the portion thereon to raise the temperature in the active layer. Because the width of the portion above the first cladding layer is narrower than that of the substrate, its heat capacity is small. Therefore, it is possible to change the temperature of the active layer and the oscillation wavelength greatly in a short time.

In expressions (I) and (II), the left inequality roughly indicates a condition for the time constant becoming small sufficiently (<<10 μs), and the right inequality roughly indicates a condition for the temperature difference between the low thermal-conductivity first cladding layer and heat flow delay layer becoming large sufficiently, as compared with the temperature difference in the substrate.

Hereinafter, referring to the accompanying drawings, various embodiments of the present invention will be explained.

Figure 6:
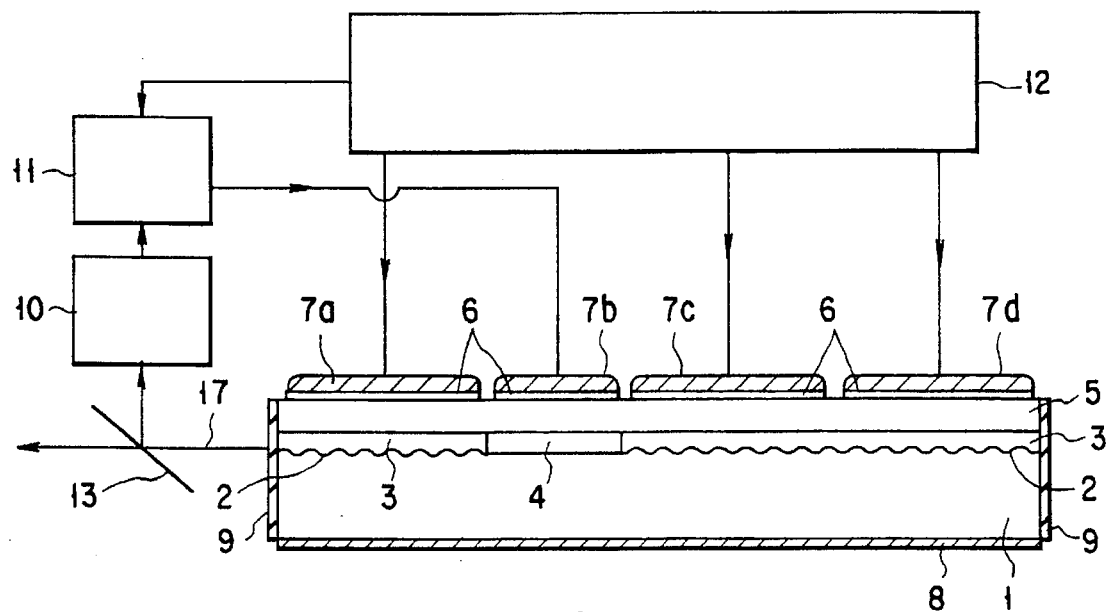
FIG. 6 is a sectional view of a multielectrode DFB semiconductor laser used for a reception system in an optical transmission apparatus according to a first embodiment of the present invention.

FIG. 6 is a schematic diagram of a multielectrode DFB semiconductor laser used for an optical transmission apparatus according to a first embodiment of the present invention.

In the figure, reference number 1 indicates an n-type InP substrate. On the n-type inP substrate 1, a diffraction grating 2 is formed, except on a portion in the direction of a resonator. On the diffraction grating 2, an InGaAsP active layer (including an optical waveguide layer) 3 is formed as an active waveguide. Furthermore, on the region where a diffraction grating is not formed in the resonator direction, an InGaAsP passive layer (including an optical waveguide layer) 4 is formed as a passive waveguide.

On the InGaAsP active layer 3 and InGaAs passive layer 4, a p-type inP cladding layer 5 and a p-type InGaAs contact layer 6 are formed. The p-type InGaAs contact layer 6 is formed so as to be separate for each electrode.

In the resonator direction, four p-type ohmic electrodes 7a, 7b, 7c, 7d are provided, of which the p-type ohmic electrode 7b is formed on the inGaAsP passive layer 4. On the both ends formed by cleavage, antireflection films 9 made of SiNx with a reflectivity of 1% or less are coated.

The laser body is fixed on a heat sink (not shown) acting as an earth electrode, with AuSu solder. The heat sink is controlled by, e.g., a temperature sensor and a Peltier element so as to remain at a constant temperature.

The p-type electrodes 7a, 7b, 7c, 7d are connected by bonding to feeders formed on a ceramic substrate. Each electrode is designed to control injection current independently. The p-type electrodes 7a, 7c, 7d are controlled by a current control unit 12 (first oscillation wavelength control means), whereas the p-type electrode 7b is controlled by an automatic frequency control circuit 11 (second oscillation wavelength control means). Specifically, part of the laser light 17 is directed to a frequency sensing unit 10 via a beam splitter 13. The frequency sensing unit 10 senses the frequency of the laser light 17. The sense result is fed back via the automatic frequency control circuit 11 to the current injected into the electrode 7b. The current control unit 12 controls the current injected into the InGaAsP active layer 3 precisely, and at the same time, supplies a signal specifying the switching of channel wavelength to the automatic frequency control circuit 11.

Here, the current control unit 12 indicates the injection of current into the active waveguide region or built-in heating means (e.g., a thin-film resistance). In the case of current injection into the active wave-guide region, since the change of carrier density takes place at the same time that the temperature changes, provision is made for the effect of temperature change to be dominant.

With this multielectrode DFB semiconductor laser, for example, when injection current into the electrode 7b is determined to be 0 mA to inject no carriers into the passive waveguide, by keeping the injection currents into electrodes 7a, 7d constant and changing the injection current into electrode 7c as much as 400 mA, it is possible to provide a continuous wavelength changing operation over a range of 5 nanometers, while maintaining the spectral line width at 1 MHz or less.

FIG. 7 shows how the oscillation wavelength changes with time when injection current into electrode 7c (active waveguide) is changed stepwise.

Here, the oscillation wavelength is changed making use of the change of refractive index in the active waveguide, and a wavelength changing action is effected by temperature change. As a result, it takes one millisecond to switch wavelengths regardless of the variable amount of wavelength. The change of oscillation wavelength rises sharply and then varies gently.

Thus, when the injection current into electrode 7c is changed linearly as shown in FIG. 8, the oscillation wavelength can be changed almost linearly with respect to time. For example, by effecting a 5-nm wavelength scanning during one millisecond, frequencies can be multiplied at channel intervals of as narrow as nearly 0.1 nanometer in coherent optical communication. This means that wavelengths for as many as 50 channels are crossed during the 5-nm wavelength scanning.

When wavelengths in a particular oscillation wavelength range are scanned making use of the change of refractive index in the active waveguide, so that each channel wavelength may be crossed, changing the injection current into electrode 7b (passive waveguide) as shown in FIG. 9 makes it possible to scan oscillation wavelengths, while tuning the oscillation wavelength to each channel wavelength. For example, by accessing each channel for 20 microseconds during the time when oscillation wavelengths are scanned through 5 nanometers in one millisecond, it is possible to switch 50 channels. Because the change of refractive index in the passive waveguide is based on the change of carrier density, the channel switching time is as fast as on the order of nanoseconds. Therefore, for example, even when a time slot allocated to each channel is as short as 20 microseconds, a sufficiently short channel switching time can be achieved.

The amount of wavelength change due to the change of carrier density in the InGaAsP passive layer 4 is as small as less than the channel interval. Thus, a very small amount of current is injected into electrode 7c, with the result that spectral line widths as narrow as 3 MHz or less can be obtained over all the channels.

Accordingly, with the embodiment, by switching each channel at high speeds through control of the injection current into the passive waveguide, while scanning wavelengths over a wide range by changing the injection current into the active waveguide, it is possible to access many channels, while maintaining a narrow spectral line width.

A first modification of the wavelength changing action in the multielectrode DFB semiconductor laser of FIG. 6 will be described with reference to FIG. 10. FIG. 10 shows how the injection currents into the InGaAsP active layer 3 (active waveguide) and the InGaAsP passive layer 4 (passive waveguide) and the oscillation wavelength change with time.

Since in an actual system, wavelengths are scanned repeatedly over a wide range, oscillation wavelengths must be scanned by switching channels one after another, starting from channel 1 toward channel n, and then the wavelength be returned to the wavelength of channel 1.

To realize this, as shown in FIG. 10, after channels are switched one after another, starting at channel 1 on the long-wavelength toward channel n on the short-wavelength side, the injection current into the active waveguide is controlled. Then, by making use of the excessive response of temperature change, it is possible to scan oscillation wavelengths as far as channel 1 on the long-wavelength side in 100 microseconds. By accessing each channel once in a millisecond, the dead time can be suppressed to 10%.

Next, a second modification of the wavelength changing action in the multielectrode DFB semiconductor laser of FIG. 6 will be described with reference to FIG. 13.

In this modification, to eliminate the dead time, as shown in FIG. 13, after oscillation wavelengths are scanned by switching channels one after another, starting from channel 1 toward channel n, they are scanned in reverse sequentially, starting from channel n toward channel 1. The wavelength scanning time for one way is determined to be 500 microseconds by controlling the injection current into the active waveguide. Thus, at least once in a millisecond, every channel can be accessed.

Figure 11:
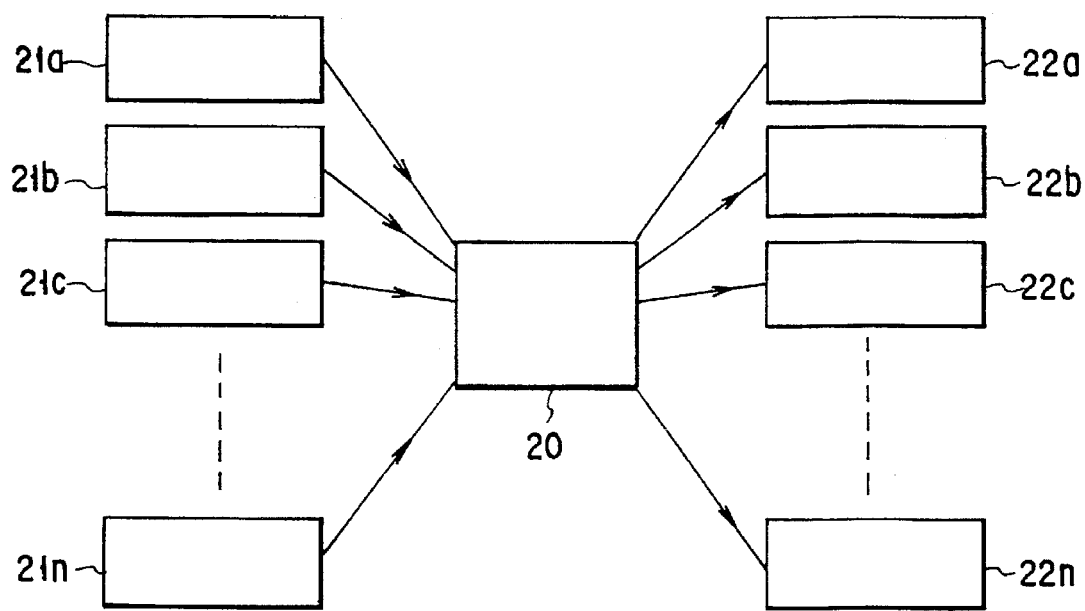
FIG. 11 is a schematic block diagram of an n-to-n optical communication system according to a second embodiment of the present invention.

FIG. 11 is a schematic block diagram of an n-to-n optical communication system according to a second embodiment of the present invention.

In the figure, reference symbols 21a to 21n indicate optical transmission systems. These optical transmission systems 21a to 21n are connected to optical reception systems 22a to 22n via a star coupler. The optical reception systems 22a to 22n use multielectrode DFB semiconductor lasers of the above embodiment as local oscillators. That is, they use semiconductor lasers capable of achieving a short channel switching time, while maintaining a narrow spectral line width over a wide range.

The optical transmission systems 21a to 21n transmit optical signals whose wavelength ranges from $\lambda_1$ to $\lambda_n$. These optical signals with wavelengths of $\lambda_1$ to $\lambda_n$ undergo frequency-division multiplexing at the star coupler 20, which sends the multiplexed signal to the optical reception systems 22a to 22n.

FIG. 12 shows the relationship between the transmission signals from the star coupler 20 (channels $ch_1$ to $ch_n$) and the oscillation wavelength of the multielectrode DFB semiconductor laser.

The transmission signals from the individual channels are synchronized so as to be shifted one time slot away from adjacent channels with respect to time. In the case of the optical reception system 22a, by scanning oscillation wavelengths stepwise as shown in FIG. 12, the optical reception system 22a can receive the transmission signal from each channel in time division.

Specifically, the reception system 22a receives a transmission signal from channel $ch_1$ using laser light with an oscillation wavelength of $\lambda_1$ at time $t_1$. Then, after it receives a transmission signal from channel $ch_2$ using laser light with an oscillation wavelength of $\lambda_2$ at time $t_2$, it receives a transmission signal from channel $ch_3$ using laser light with an oscillation wavelength of $\lambda_3$ at time $t_3$. Similarly, it receives a transmission signal from each of the remaining channels. The reception systems 22b to 22n can also receive transmission signals from all the channel in the same way.

In the optical communication system of this embodiment, the transmission signals from the individual channels must be synchronized throughout the network, so that it is necessary to cause a controller for the entire network to transmit a control signal for this purpose to each channel. To do this, for example, a single channel wavelength may be allocated to this control signal, or a control signal may be sent as a magnitude modulation signal during the dead time.

The variable amount of wavelength due to the change of carrier density in the InGaAsP passive layer 4 is not required to be less than the channel interval. The injection current into the passive waveguide thus can be changed in a range where a narrow spectral line width can be maintained.

For example, by controlling the injection current into the passive waveguide as shown in FIG. 14, the time slots allocated to channel $ch_{i-1}$ and channel $ch_{i+1}$ are used for communication with channel $ch_i$.

The time slot allocated to each channel need not be equal in length for all the channels. Furthermore, wavelength scanning according to temperature need not be linear with respect to time. The period in which wavelengths are scanned by switching channels need not be constant.

The time required to scan wavelengths from channel $ch_1$ to channel $ch_n$ may be different from the time required to scan wavelengths from channel $ch_n$ to channel $ch_1$.

Figure 15:
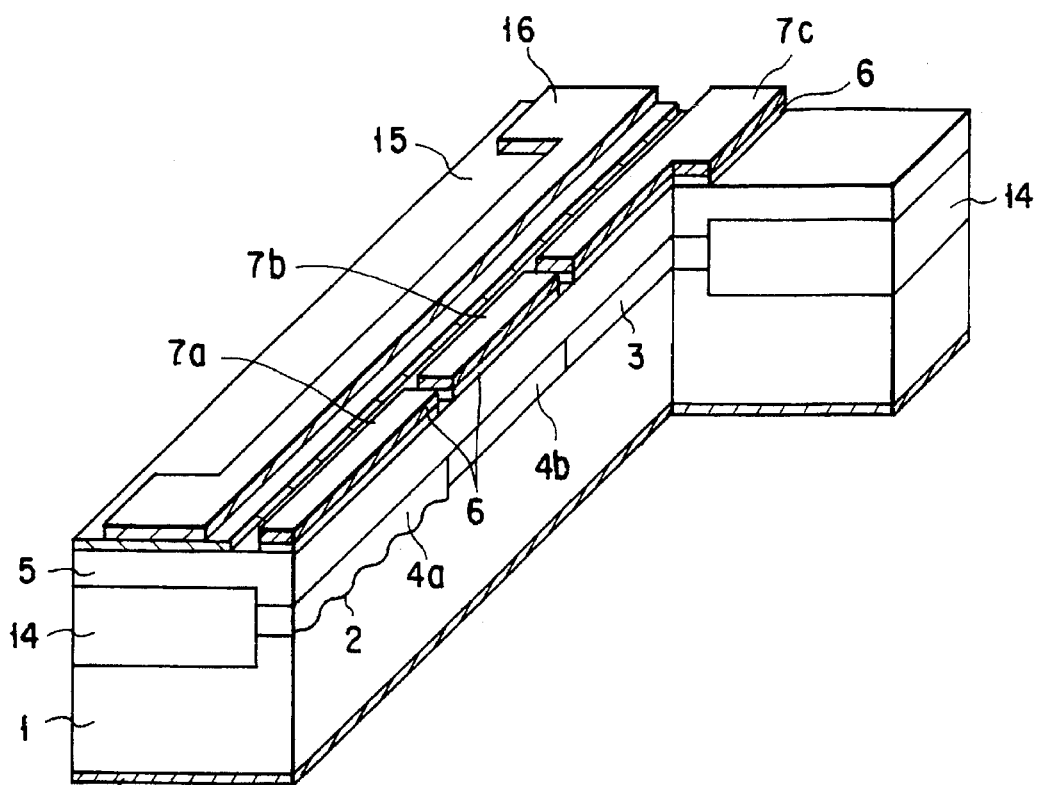
FIG. 15 is a schematic diagram of a multielectrode DFB semiconductor laser used for a reception system in an optical transmission apparatus according to a third embodiment of the present invention.

FIG. 15 is a schematic diagram of a multielectrode DFB semiconductor laser used for a reception unit of an optical transmission apparatus according to a third embodiment of the present invention. The parts corresponding to those in the multielectrode DFB semiconductor laser of FIG. 6 are indicated by the same symbols, and their detailed explanation will be omitted.

On the n-type InP substrate 1, an InGaAsP active layer (including an optical waveguide layer) 3 and InGaAsP passive layers (including an optical waveguide layer) 4a, 4b are formed. Under the InGaAsP passive layer 4b, a diffraction grating 2 is formed. After the InGaAsP active layer 3 and the InGaAsP passive layers 4a, 4b are etched into a mesa form, they are buries with a semi-insulating InP layer 14.

On the InGaAsP active layer 3, InGaAs passive layers 4a, 4b and semi-insulating inP layer 14, a p-type InP cladding layer 5 is formed. On the p-type InP cladding layer 5, a p-type inGaAs contact layer 6 and p-type ohmic electrodes are formed in three separate pieces in the direction of the resonator so as to correspond to InGaAsP layers 4a, 4b, 4c. A heating Pt thin-film resistance 16 is formed so as to be insulated from the p-type InP cladding layer 5 by an SiO$_2$ film 15.

With the multielectrode DFB semiconductor laser thus constructed, oscillation wavelength control according to temperature change is effected by injecting current into the Pt thin-film resistance 16, while oscillation wavelength control according to the change of carrier density is performed by current injection into the passive waveguide. The current injection into the passive waveguide is carried out by injecting current into electrode 7a or electrode 7b. Current injections into electrodes 7a and 7b may be controlled simultaneously. A practical method for such control is similar to that in the first embodiment. Various wavelength changing actions are possible.

The present invention is not limited to the above embodiments. For instance, while in the embodiments, an InGaAsP-series semiconductor laser is used, the invention may be applied to various material series such as InGaAlAs series, AlGaInAs series, AlGaInP series, InGaAsSb series, or ZnCdSSe series.

The substrate is not limited to an n-type substrate. An antireflection coating may not be applied to the ends.

Furthermore, the lateral structure of the semiconductor laser is not restricted to a semi-insulating layer buried structure. The active layer and the passive layer may be formed of bulk material or a quantum well structure.

In addition, the position of the passive waveguide and active waveguide in the direction of the resonator, the position where the diffraction grating is provided, the number of divided electrodes, the position where the heating means is provided, and the number of heating means may be changed as required.

Additionally, the present invention may be practiced or embodied in still other ways without departing from the spirit or essential character thereof.

As has been described in detail, with the embodiments shown in FIGS. 6 to 15, the first oscillation wavelength control means for controlling the oscillation wavelength primarily according to temperature enables scanning over a wide wavelength range, while keeping a narrow spectral line width, and the second oscillation wavelength control means for controlling the oscillation wavelength largely according to carrier density enables a desired wavelength to be selected from the wavelength range in a short time. As a result, it is possible to achieve a short channel switching time, while maintaining a narrow spectral line width over a wide range.

Figure 16:
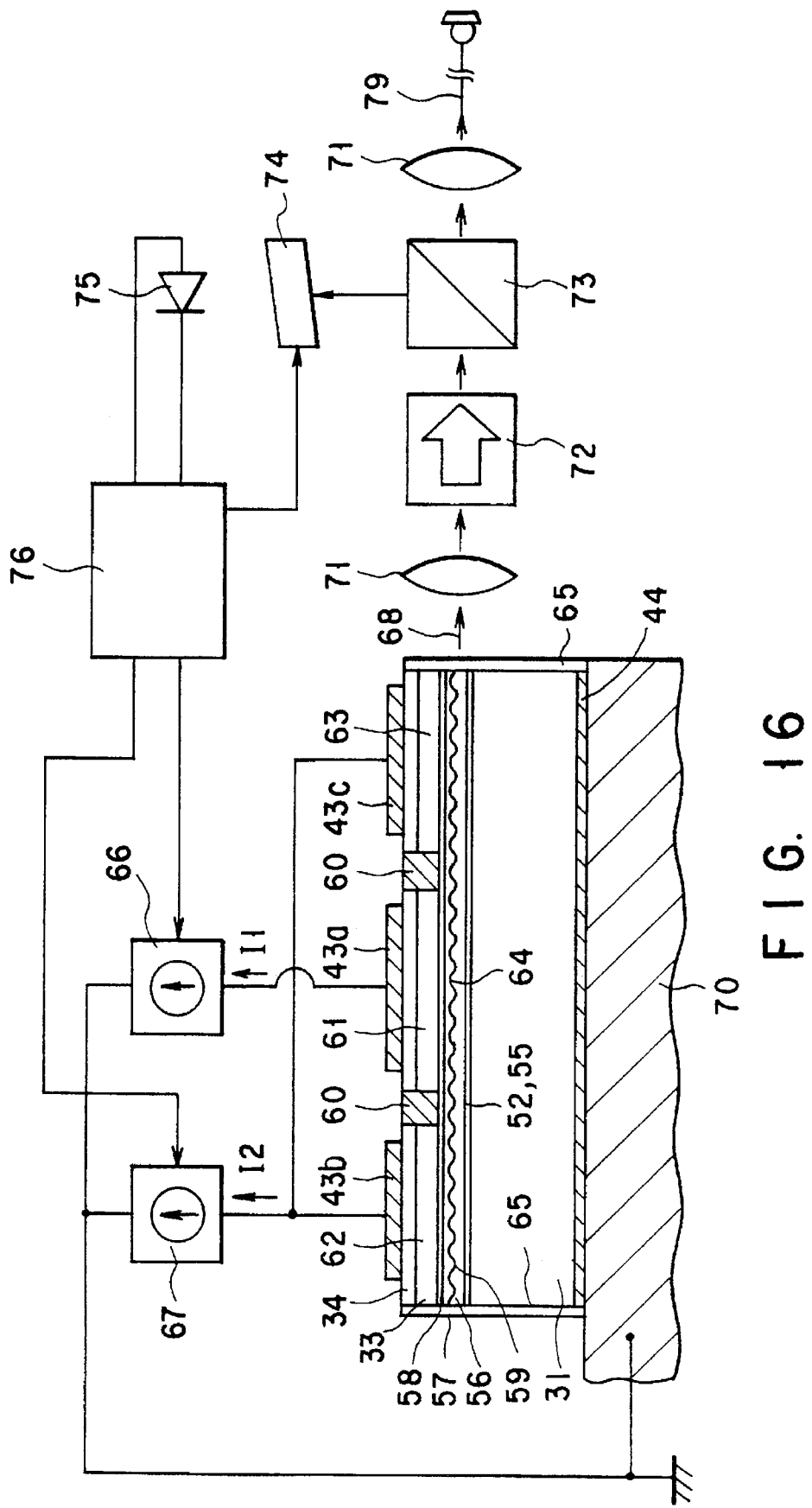
FIG. 16 is a schematic diagram of a three-electrode DFB semiconductor laser device according to a fourth embodiment of the present invention.

FIG. 16 is a schematic diagram of a three-electrode DFB semiconductor laser according to a fourth embodiment of the present invention. The three-electrode DFB semiconductor laser device is broadly divided into a semiconductor laser chip and a feedback system.

FIG. 17 is a sectional view of the semiconductor laser chip taken along a plane parallel to the emission surface. FIG. 18 is a band diagram of the vicinity of the active layer in the semiconductor laser chip of FIG. 17.

The semiconductor laser chip basically comprises: a p-type InP substrate 31; a striped optical waveguide structure 32 formed on the p-type InP substrate 31, the width of each stripe being approximately 1 μm; an n-type InP cladding layer 33 and an n-type InGaAsP ohmic contact layer 34 formed in sequence on the optical waveguide structure 32; and a buried layer for embedding the optical waveguide structure 32. The buried layer is composed of a strained InAlP layer 35, an n-type InP buried layer 36, a p-type InP buried layer 37, and a p-type InAlAs/InP superlattice layer 38. The p-type InP substrate 31 also serves as a p-type cladding layer.

On both sides of the stripe, grooves 41 are formed a little away. On top of a mesa portion 42 formed by these grooves 41, an n-type ohmic electrode 43 is formed. On the bottom of the substrate, a p-type ohmic electrode 44 is formed. Although not shown in the figure, the n-type ohmic electrode 43 is connected to a bonding pad through interconnection via an insulating film.

The optical waveguide structure 32 is made up of a hetero barrier layer, an active layer, and an optical waveguide layer. Specifically, as shown in FIG. 18, a 30-nm thick p-type InGaAlAs layer 51, a 30-nm-thick undoped InGaAsP lower optical waveguide layer 52, a strained quantum well structure active layer 55, a 100-nm-thick undoped InGaAsP upper optical waveguide layer 56, a 70-nm-thick undoped InP layer 57, and a 50-nm-thick undoped InAlAs barrier layer 58 (a barrier layer for adding energy to carriers injected into the active layer) are stacked from the bottom up in that order.

The strained quantum well structure active layer 55 is such that a 3-nm-thick InGaAs strained quantum well layer 53 and a 10-nm-thick inGaAsP barrier layer 54 having lattice-matching with InP and corresponding to a wavelength of 1.3 µm are stacked on top of another alternately to form a six-layer structure.

Although the laser light 68 is directed largely by the high refractive-index strained quantum well structure active layer 55, undoped InGaAsP lower optical waveguide layer 52, and undoped InGaAsP upper optical waveguide layer 56, it oozes as far as the n-type InP cladding layer 33 and p-type InP cladding layer (substrate) 31, with the result that a considerable amount of power is distributed in the undoped InP layer 57 and undoped InAlAs barrier layer 58.

The n-type InGaAsP ohmic contact layer 34 and n-type InP cladding layer 33 are divided into three pieces by isolation layers 60 made of semi-insulating InP layers, thereby forming three current injection regions 61, 62, 63. Further, the n-type ohmic electrode 43 is divided into three n-type ohmic electrodes 43a, 43b, 43c so as to correspond to the current injection regions 61, 62, 63.

Formed on the undoped InGaAsP upper optical waveguide layer 56 is a first-order diffraction grating 59 acting as a laser resonator buried flatly with the undoped InP layer 57. The Bragg wavelength of the diffraction grating 59 is set at nearly the laser gain peak wavelength. In the center of the diffraction grating 59, a (¼ wave) phase shifter 64 is formed.

Since the both ends formed by cleavage are coated with antireflection films 65 made of SiNx with a reflectivity of 0.1% or less, Fabry-Perot mode oscillation is suppressed. Consequently, it is possible to realize a stable single mode oscillation with a spectral line width of 2 MHz or less over a wide current setting range.

The semiconductor laser chip is approximately 1 mm long, 300 µm wide, and 80 µm thick. The length of the central portion 61 is approximately 400 µm. The end portions 62, 63 are each 300 µm long.

The semiconductor laser chip is fixed on a heat sink 70 acting as an earth electrode, with AuSu solder. The heat sink 70 is controlled by a temperature sensor and a Peltier element so as to remain at a constant temperature. The individual electrode pads are connected by bonding to feeders formed on a ceramic substrate. A first current source 66 is connected to the electrode 43a on the central portion and a second current source 67 is connected to the electrodes 43b and 43c on both ends. The current in the central portion and those in the end portions can be controlled independently.

On the other hand, the feedback system is composed of a lens system 71, an optical isolator 72, a beam splitter 73, a frequency discriminator etalon 74, a monitor photodiode 75, a control IC 76, and a pigtail 79. The feedback system, together with the semiconductor laser chip, is housed in a module. The operation of the feedback system is almost the same as that of the conventional one in FIG. 4 except that the frequency discriminator etalon 74 is used to sense an error signal instead of the Mach-Zehnder interferometer 144. In the figure, numeral 79 indicate the fiber pigtail.

Before explanation of a concrete operation of the semiconductor laser device associated with this embodiment, a mechanism of wavelength change due to current change will be explained.

It is assumed that the first current source 66 and the second current source 67 are caused to flow specific currents $I_1$ and $I_2$ and thereby a single-mode oscillation is taking place at a specific wavelength. Here, an operation will be considered when current $I_1$ and current $I_2$ are increased to shift the oscillation wavelength greatly toward the long-wavelength side. A wavelength shift due to current change is caused mainly by the Bragg wavelength change due to refractive index change. The effect of size changes due to thermal expansion and gain wavelength changes due to temperature rise on the oscillation wavelength are negligible.

Bragg wavelength changes due to refractive index changes vary the effective phase shift amount in the central portion. Because a change in the phase shift amount changes the oscillation mode position in the stop band, a shift of oscillation wavelength results. At this time, when the mode wavelength determined by the phase is shifted considerably away from the Bragg wavelength, a mode jump occurs. Although this effect cannot be ignored, to simplify the discussion, it is assumed that the ratio of current $I_1$ to current $I_2$ is set so that the phase condition may not change greatly. When this condition is not met, for example, when the wavelength is changed with the power kept constant, the ratio of current $I_1$ to current $I_2$ changes, and consequently the oscillation wavelength is shifted a little away from the Bragg wavelength. However, the basic operation is the same.

A change in the refractive index is caused by a change in the carrier density (carrier effects) and a change in the temperature (thermal effects). Generally, when current is increased, the carrier density in the optical distribution region rises and the refractive index decreases because of plasma effects, with the result that the carrier effects give rise to a blue shift of wavelength. The response speed of refractive index changes due to plasma effects is below a picosecond, which can be considered to be momentary as compared with the time constant of the current change. However, it takes time of the order of nanoseconds for the carrier distribution to become balanced in the resonator. Generally, the time required to reach the balanced state is the time constant of a change in the wavelength due to carrier effects.

On the other hand, an increase in the current causes a red shift of wavelength because of an increase in the refractive index due to a temperature rise in the optical waveguide region (optical waveguide structure). The rate of wavelength change due to a temperature rise in the optical waveguide region is nearly 0.1 mn/°C. A change in the refractive index due to the temperature rise can be considered to be momentary as compared with the rate of temperature change.

A temperature rise in the optical waveguide region is classified into a direct temperature rise caused by heat generation in the optical waveguide region and an indirect temperature rise resulting from externally generated heat reaching the optical waveguide region.

The response speed of heat generation due to a current increase in the optical waveguide region is on the order of the relaxation time of carriers, or a picosecond at most. Since the heat capacity is large, however, it takes time of the order of several nanoseconds for an actual temperature rise to become significant.

On the other hand, the primary heat generating source outside the optical waveguide region is the resistance of the p-type ohmic electrode and n-type cladding layer, when an n-type substrate is used. Since heat conduction needs time, it takes time of the order of hundreds of nanoseconds to several microseconds for a temperature rise in the active layer due to the heat generation from the p-type ohmic electrode to become significant. In the case of a p-type substrate, since the resistivity of the n-type cladding layer and the resistance of the n-type contact are low, the current path becomes wider in the p-type substrate, and additionally a p-type contact can be formed near a heat sink, a contribution of heat generation from outside the optical waveguide region is smaller than when an n-type substrate is used. In either conductivity-type substrate, it generally takes several milliseconds to hundreds of milliseconds for the temperature distribution in the entire semiconductor on the heat sink to become balanced. This time is the time constant of the wavelength change due to thermal effects.

Figure 19:
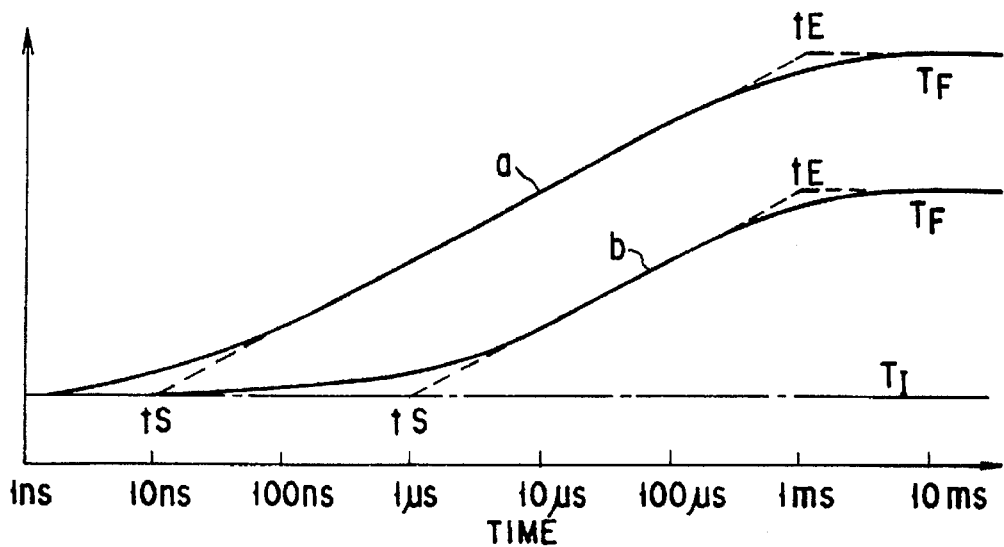
FIG. 19 is a diagram of how the temperature in the optical waveguide region changes with time according to heat generation.

FIG. 19 shows how the temperature in the optical waveguide region changes with time according to heat generation.

In the figure, curve a represents a temperature rise due to the heat directly generated by the optical waveguide region, and curve b indicates a temperature rise due to the heat generation from the p-type ohmic electrode. For the same amount of heat generation, a temperature rise caused by the heat generated by portions away from the optical waveguide region is smaller than that caused by the heat directly generated in the optical waveguide region. This temperature change curve is approximated by the following curves (the dotted lines in the figure):

$$T = \begin{cases} T_I & (t \leq t_s) \\ T_I + (T_F - T_I)\frac{\log(t/t_s)}{\log(t_E/t_s)} & (t_s \leq t \leq t_E) \\ T_F & (t_E \leq t) \end{cases} \quad \text{(III)}$$

In equation (III), T is a temperature, $T_1$ is the temperature initial value, $T_F$ is the temperature final value, t is time, $t_s$ is the time at which a temperature rise becomes significant, and $t_E$ is the time at which the temperature almost reaches a balanced state. To simplify the discussion, this approximation will be used hereinafter.

A concrete wavelength switching operation in the semiconductor laser of the first embodiment will be described in detail with reference to the wavelength switching operation in the conventional three-electrode DFB semiconductor laser device of FIG. 4. For either device, the laser is worked into a mesa form. Because the current rising time under the parasitic CR limit is negligibly sub-nanoseconds. The charging and discharging time associated with carriers accumulated in or released from the band discontinuous portions with the undoped InAlAs barrier layer 28 is nanoseconds or less, which is negligible as compared with the wavelength change time discussed here.

Figure 20A:
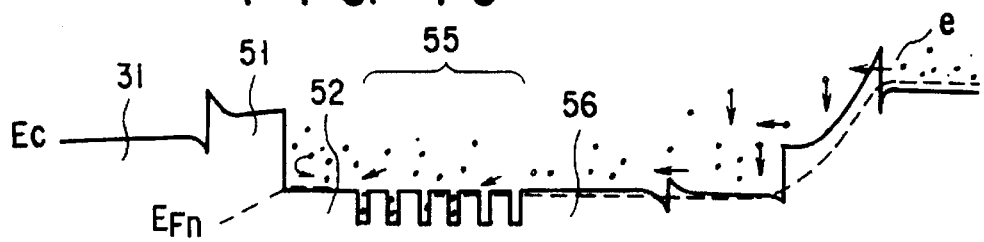
FIG. 20 is a band diagram of the vicinity of the optical waveguide region in the three-electrode DFB semiconductor laser device of FIG. 16 with a voltage applied.
Figure 20B:
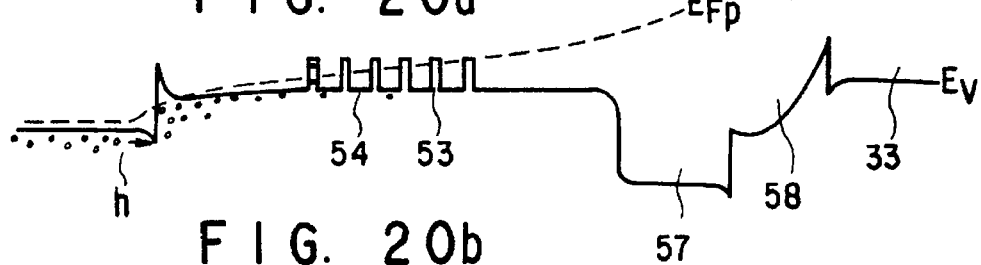
Figure 21A:
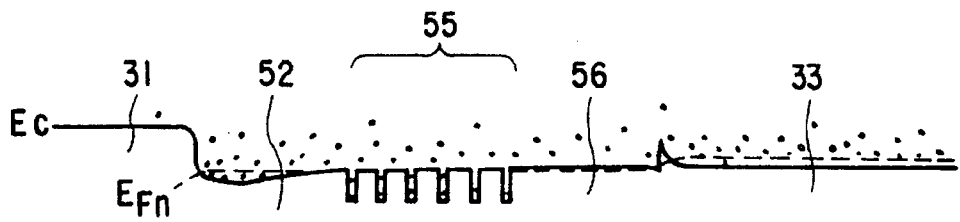
FIG. 21 is a band diagram of the vicinity of the optical waveguide region in a conventional three-electrode DFB semiconductor laser device with a voltage applied.
Figure 21B:
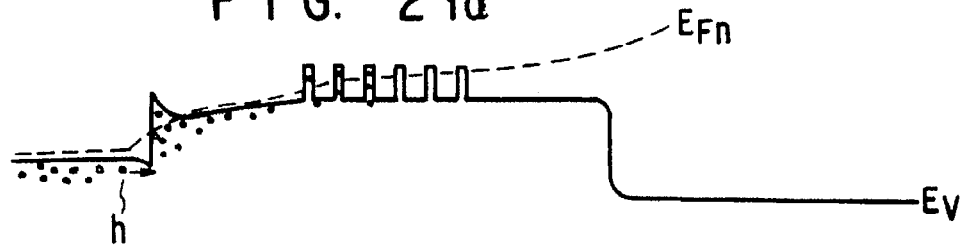

Band diagrams of the vicinity of the optical waveguide region when a voltage is applied in the three-electrode DFB semiconductor laser device of this embodiment and that of FIG. 4 are shown in FIGS. 20 and 21, respectively. In the figures, $E_C$, $E_V$, $E_{Fn}$, and $E_{Fp}$ indicate a conduction band end, a valence band end, an electron quasi Fermi level, and a hole quasi-Fermi level, respectively.

Figure 22A:
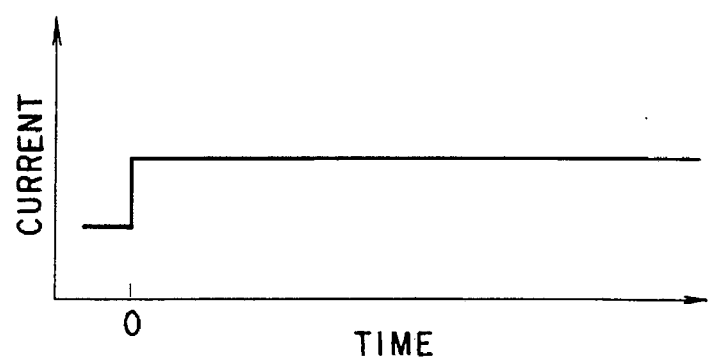
FIGS. 22A to 22D are diagrams of how the supplied current changes with time.
Figure 23:
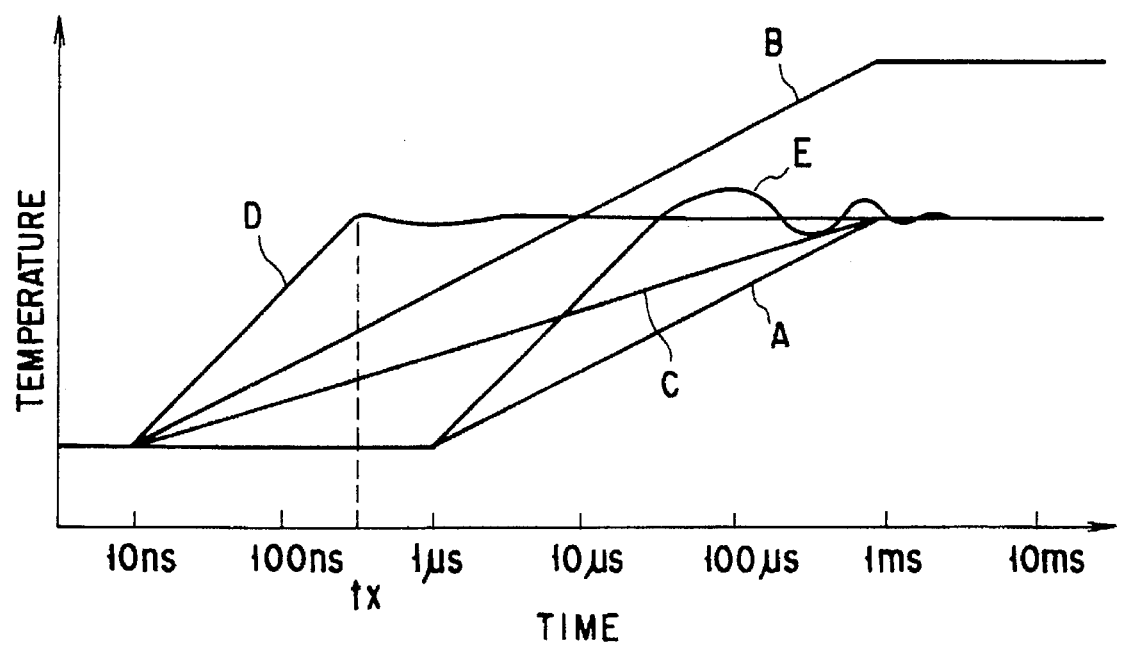
FIG. 23 is a diagram of how the temperature in the optical waveguide region changes according to the applied currents of FIGS. 22A to 22D.
Figure 24:
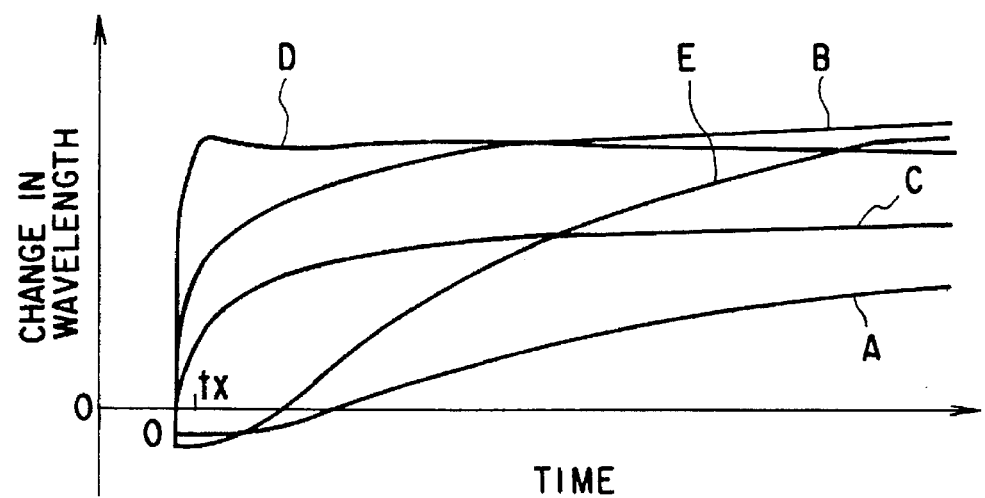
FIG. 24 is a diagram of how the oscillation wavelength changes according to the applied currents of FIGS. 22A to 22D.

In the case of the conventional three-electrode DFB semiconductor laser device, because a proportion of heat generation from outside the optical waveguide region is large, when the current is increased as shown in FIG. 22A, the temperature in the optical waveguide region changes as represented by characteristic curve A in FIG. 23, and the oscillation wavelength change including carrier effects is represented by characteristic curve A in FIG. 24. That is, when the oscillation wavelength is changed greatly, it take time to stabilize the oscillation wavelength.

On the other hand, in the case of the three-electrode DFB semiconductor laser device, by applying an extra voltage (0.3 to 1V) to the undoped InAlAs barrier layer 58 to lower and thin a barrier to electrons, high-energy electrons e⁻ are injected into the undoped InGaAsP lower optical waveguide layer 52, strained quantum well structure active layer 55, undoped InGaAsP upper optical waveguide layer 56, and undoped InP layer 57 through thermal excitation and tunnel effect.

Because the injected electrons e⁻ are converted into thermal energy through relaxation immediately, time $t_s$ that the temperature starts to rise is earlier than that in the conventional equivalent. Since the p-type InP substrate 1 is used, the effect of heat generation from outside the optical waveguide region is smaller than that in the conventional one.

As a result, when the current is changed as shown in FIG. 22A, the temperature change and the oscillation wavelength change are as represented by characteristic curves B in FIGS. 23 and 24. That is, the time required for the oscillation wavelength to become stable is shorter than that in the previous case.

Figure 22B:
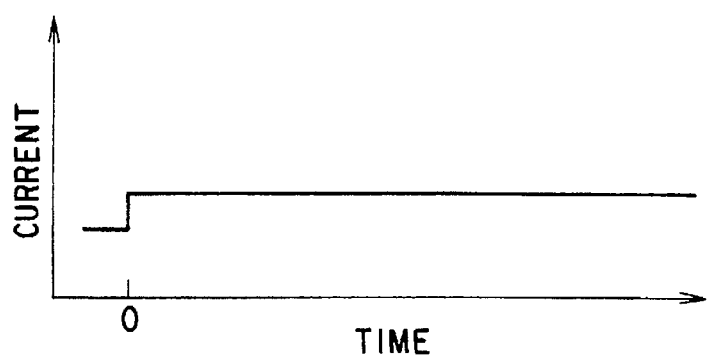
Figure 22C:
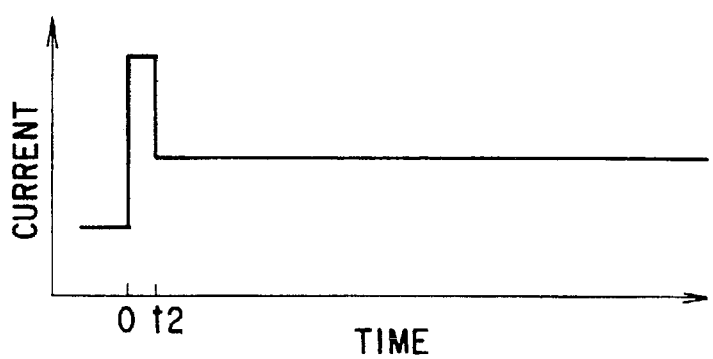

Further, when the current is changed as shown in FIG. 22B and the final oscillation wavelength is made equal to that of the conventional one, the temperature change and the oscillation wavelength change are as represented by characteristic curves C in FIGS. 23 and 24. In this case, because a change in the current is small, the carrier effects are relatively small, making it easy to effect feedback control. However, since the time required for the oscillation wavelength to become stable depends largely on the heat capacity of the entire semiconductor, the time needed for the oscillation wavelength to be stable is only a little shorter than that in the conventional one (characteristic curve A).

To overcome this drawback, an extra current is allowed to flow until the oscillation wavelength reaches a specific value near a desired value. At time $t_X$ when the oscillation wavelength has reached the specific value, the current is reduced to the vicinity of the specific value in a balanced state. The temperature change and the oscillation wavelength change at that time are represented by characteristic curves D in FIGS. 23 and 24, respectively. Namely, as compared with the conventional one (characteristic curve A), the oscillation wavelength can be tuned to the desired value in a very short time.

The extra current supplied until time $t_X$ is not necessarily constant. In this embodiment, because a contribution to a temperature drop in the optical waveguide region in reducing the current at time $t_X$ offsets an inflow of heat from other regions to some extent, the temperature change at time $t_X$ and later is small. However, because of the effect of low time constant components of temperature, the wavelength fluctuates near the desired value. To overcome this problem, for example, by turning off an ordinary AFC from time 0 to time $t_X$ (or setting the AFC parameters to values different from the normal values) and starting the AFC in a normal mode at time $t_X$, the wavelength fluctuations can be suppressed.

Furthermore, with this embodiment, because the response speed of current to wavelength is fast, a fast, stable AFC can be effected. Therefore, according to the embodiment, even if a complex feedback system is not used, it is possible to change the oscillation wavelength greatly at much faster speeds than with the conventional three-electrode DFB semiconductor laser device, and to stabilize the oscillation wavelength in a shorter time.

Figure 22D:
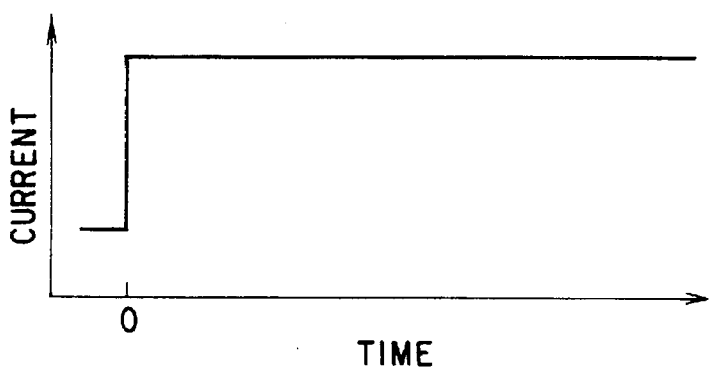

Even with the conventional three-electrode DFB semiconductor laser device, use of an extra current as shown in FIG. 22D can shorten the oscillation wavelength switching time. In this case, however, as represented by characteristic curves E in FIGS. 23 and 24, it is impossible to shorten the switching time remarkably as in the present embodiment. In addition, since the response speed of the oscillation wavelength change due to current change is slow, it is impossible to effect a stable, fast AFC, with the result that it takes hundreds of microseconds to more than milliseconds for the oscillation wavelength to be stable. Namely, as with the present embodiment, only when the time that a heat response starts is advanced by causing the optical waveguide region to be the main heat generating region, the above-mentioned problem will be solved.

Conversely, when the oscillation wavelength is shorten by reducing the current, a high speed response can be achieved by reducing the current excessively during the time when the oscillation wavelength comes close to the desired value. To monitor the oscillation wavelength even when the current is reduced excessively, it is necessary to set a normally used bias range at a little higher level, which limits the variable range of oscillation wavelength that can be used normally. However, if how the temperature changes is known previously, this limit can be alleviated by additionally using the technique of making the current zero without monitoring the oscillation wavelength for the time corresponding to the magnitude of the oscillation wavelength to be changed.

In the embodiment, a voltage drop in the strained quantum well structure active layer 55 is large to achieve high speeds, but the current allowed to flow in a steady state is small to make the oscillation wavelength longer. Therefore, the primary increment in the power consumption contains the increment in the power consumption at the time of the shortest wavelength oscillation and the power consumption due to an extra current flowing at the time of high-speed wavelength switching. This is thus almost no problem. However, it is necessary to make larger the maximum power that the power supply can supply.

When electrons injected into the undoped InGaAsP lower optical waveguide region 52, strained quantum well structure active layer 55, and undoped InGaAsP upper optical waveguide region 56 have large energy, part of the electrons are injected into the p-type InP cladding layer (substrate) 1, introducing the danger of increasing an ineffective current noncontributory to laser oscillation.

To prevent such ineffective current from being generated, in this embodiment, the p-type InGaAlAs layer 51 is provided between the undoped InGaAsP lower optical waveguide region 52 and the p-type InP substrate 31. Since the p-type InGaAlAs layer 51 acts as a barrier layer to electrons flowing into the p-type InP substrate 1, it is possible to prevent electrons from overflowing. Thus, even under conditions where the temperature in the optical waveguide region is high, overflow current can be suppressed to a low level.

The position of the valence band peak in the p-type InGaAlAs layer 51 is set so that the injection of holes from the p-type InP substrate 31 into the undoped InGaAsP lower optical waveguide region 52 may not be disturbed. Thus, a decrease in the current response speed due to the hole transport time is negligible.

With the three-electrode DFB semiconductor laser device of the embodiment, since the applied voltage between electrodes is higher, it is necessary to make sufficiently high the breakdown voltages of the buried strained InAlAP layer 35, n-type InP layer 36, p-type InP layer 37, and p-type InAlAs/InP superlattice layer 38. Most of the applied voltage becomes a reverse bias between the n-type InP layer 36 and the p-type InP layer 37. In this embodiment, the injection of holes from the p-type InP substrate 31 into the n-type InP layer 36 is prevented effectively by the strained InAlP layer 35. The injection of electrons from the n-type InP cladding layer 33 into the p-type InP layer 37 is prevented effectively by the p-type InAlAs/InP superlattice layer 38. As a result, carrier injection into the reverse bias region does not take place even in the vicinity of the active layer where an electric field is high, so that an increase in the leak current and the turning off of a thyristor-like structure can be prevented.

In multi-electrode DFB lasers, since the carrier distribution in the resonator is inherently very nonuniform due to hole burning in the axis direction, when an increase in the current helps alleviate hole burning in the axis direction, the overall average carrier density decreases, which may allow carrier effects to cause a red shift.

For instance, when current $I_2$ at both ends is set rather high and current $I_1$ in the central portion is increased, starting at a small value, the effect of hole burning is reduced and a red shift due to carrier effects may take place. The shift amount, however, is small. As in the embodiment, when $\kappa L$ ($\kappa$: a diffraction coupling factor, L: a resonator length) is not so large and the ratio of current $I_1$ to $I_2$ is set at a specified value, a wavelength shift due to carrier effects is always a blue shift. Even if carrier effects acts on a red shift, the present invention remains effective.

When frequency modulation (FM) was applied to the central electrode in the conventional three-electrode DFB semiconductor laser device, a red shift, less frequency-dependable, great FM modulation efficiency was obtained only under the bias conditions just after a mode jump.

However, when frequency modulation is performed in the three-electrode DFB semiconductor laser device of the embodiment, because the device does not depend much on the bias current, and because the level of the heat response is large and the time constant is small, a flat, large red-shift FM modulation efficiency can be realized over a wide bias range as well as a wide frequency range.

While in the embodiments of FIGS. 16 to 24, to prevent the overflowing of electrons, the p-type InGaAlAs layer 51 is provided as a barrier layer to electrons, providing a barrier to holes gives a similar effect. In addition, barriers to both electrons and holes may be provided, or more than one barrier may be provided to either electrons or holes.

The overflow-preventing barrier layer may be made of a material which has no grating matching with the p-type InP substrate 31 like the strained InAlAP layer 35. It may have such a structure as forms a high composite barrier made of more than one material like the p-type InAlAs/InP superlattice layer 38. Materials are not limited to III–V group semiconductors such as InAlAs. For instance, a barrier made of a II–VI group semiconductor may be used. Furthermore, doners, acceptors, traps (e.g., iron) may be doped as required.

As long as the barrier layer is located in the optical waveguide regions, or the regions where light experiences the change of refractive index, it may be positioned in a suitable place instead of between the cladding layer and the optical waveguide layer. For instance, it may be in the optical waveguide layer, or in the cladding layer.

Furthermore, while in the embodiments of FIGS. 16 to 24, the p-type InGaAlAs layer 51 is formed over all the regions, it may be formed over the central current injection region 61 only. In this case, the central current injection region 61 is where the oscillation wavelength changes greatly due to thermal effects, while the current injection regions 62, 63 at both ends are where the oscillation wavelength changes less greatly due to thermal effects. Therefore, for example, it is possible to apply APC to the current injection regions 62, 63 at both ends and AFC to the central current injection region 61.

This invention is not limited to the above embodiments. For instance, while in the above embodiments, a three-electrode DFB semiconductor laser device is used, this invention may be applied to DFB semiconductor laser devices with two electrode or four or more electrodes.

The order in which the strained quantum well structure active layer 52, diffraction grating 59, and undoped InAlAs barrier layer are stacked is not restricted to that in the above embodiments.

Furthermore, a similar effect may be obtained by applying the invention to various structures including: a structure with a region having another function such as phase control in the resonator direction, a structure asymmetric with the resonator, a structure where separated regions differ from each other in their active layers, diffraction gratings, and cross sections, a structure without a phase shift structure, a structure with separated phase shift regions, a structure where window regions without active layers are provided at the ends, and a inclined-end structure where the emission surface is not perpendicular to the active layer stripes. Additionally, the buried structure is not limited to that in the above embodiments.

Furthermore, the invention may be applied to a photonic IC or a laser array. Still further, this invention may be practiced or embodied in still other ways without departing from the spirit or essential character thereof.

As has been explained in detail, according to the embodiments of FIGS. 16 to 24, a barrier layer provided in the optical waveguide structure enables high energy carriers to be injected into the active layer. As a result, the change of injection current realizes a fast, large wavelength shift, thereby achieving a fast wavelength changing operation as compared with conventional multielectrode DFB lasers.

FIGS. 25 and 26 are schematic sectional views of a three-electrode DFB semiconductor laser device according to a fifth embodiment of the present invention. FIG. 25 is a sectional view taken in the direction perpendicular to the stripes of an active layer. FIG. 26 is a sectional view taken in the direction parallel to the stripes of the active layer.

In the figure, numeral 81 indicates an n-type InP substrate. On the n-type InP substrate 81, a mesa portion 92 having a width of approximately 7 µm is formed which is composed of an n-type InGaAsP cladding layer 82, a p-type InP layer 87, an n-type inP layer 88, a p-type InP cladding layer 85, and a p-type InGaAsP ohmic contact layer 86, as shown in FIG. 25.

The n-type InGaAsP cladding layer 82 has its top narrowed. Specifically, it has a thickness of 3.5 µm, of which the top 0.5 µm is worked into a width of 1 µm equal to that of an active layer 84. For the composition ratio of InGaAsP, the forbidden band width corresponds to a wavelength of 1.05 µm.

On the narrowed portion of the n-type InGaAsP cladding layer 82, a 1 µm-wide striped strained quantum well active/optical waveguide layer 84 is formed. The narrowed portion of the n-type InGaAsP cladding layer 82 is buried with the p-type InP layer 87 and the n-type InP layer 88.

The purpose of introducing a strained quantum well structure into the active layer is to lower an oscillation threshold to improve the temperature characteristic and thereby to reduce adverse effects due to a rise in the temperature of the active layer in normal operation. Instead of the strained quantum well structure, a simple quantum well structure may be used.

On the strained quantum well active/optical waveguide layer 84, a 1 µm-thick p-type InP cladding layer 85, a 0.5 µm-thick p-type InGaAsP ohmic contact layer 86 are formed in sequence. A p-side ohmic electrode 89 is provided on the p-type InGaAsP ohmic contact layer 86, and an n-side ohmic electrode 90 is provided on the n-type InP substrate 81. Although not shown in the figure, on both sides of the mesa portion 92, plateaus are formed across grooves. Bonding pads formed above the plateaus via insulating films are connected to the p-side ohmic electrode 89 by means of bridge wires. Here, the height of the mesa portion is 5.2 µm.

As shown in FIG. 26, the p-type InGaAsP ohmic contact layer and p-side ohmic electrode 89 are divided by semi-insulating InP layers 96 into three pieces: a first current injection region 97 in the center, a second current injection region 98 and a third current injection region 99 at both ends.

On the strained quantum well active/optical waveguide layer 84, a first-order diffraction grating 93 is formed. The Bragg wavelength of the diffraction grating 93 is set at nearly the laser gain peak wavelength. In the center of the resonator of the diffraction grating 93, a (¼ wave) phase shifter 94 is formed.

Since the both ends formed by cleavage are coated with antireflection films 95 made of SiNx with a reflectivity of 0.1% or less, Fabry-Perot mode oscillation is suppressed. Consequently, it is possible to realize a stable single mode oscillation with a spectral line width of 2 MHz or less over a wide current setting range. The semiconductor laser chip is approximately 1 mm long, 300 µm wide, and 80 µm thick. The length of the central current injection region 97 is approximately 400 µm. The end portions 97, 98 are each approximately 300 µm long.

The semiconductor laser chip is fixed on a heat sink 91 acting as an earth electrode, with AuSu solder. The heat sink 91 is controlled by temperature control means composed of, e.g., a temperature sensor and a Peltier element so as to remain at a constant temperature. The individual electrode pads are connected by bonding to feeders formed on a ceramic substrate. The current in the central portion and those in the end portions can be controlled independently. These components are housed in a module, which also houses a lens system, an optical isolator, a beam splitter, a frequency discriminator etalon, a monitor photodiode, a driving control IC, and a pigtail.

FIGS. 27A to 27C are diagrams of thermal conductivity of III–V group semiconductor mixed crystals.

Generally, the thermal conductivity of semiconductor mixed crystals with three elements or more is much lower than that of those with two elements. For example, the thermal conductivity of InP is approximately 70 W/(m·K) at room temperature, whereas that of $In_{0.53}Ga_{0.47}As$ is approximately 4 W/(m·K), more than one digit smaller. The difference in the specific heat between those semiconductors due to the difference in the composition ratio is small, and each semiconductor mixed crystal has a specific heat of approximately $1.5 \times 10^6 J/(m^3 \cdot K)$.

In this embodiment, the n-type InGaAsP cladding layer 82 is made of a four-element semiconductor mixed crystal, whose thermal conductivity is lower than that of the n-type InP substrate 1, or as low as less than approximately 10 W/(m·K).

Because of this, when current is injected into the strained quantum well active/optical waveguide layer 84, which then generates heat, a flow of heat from the strained quantum well active/optical waveguide layer 84 into the n-type InP substrate 81 is blocked by the n-type InGaAsP cladding layer 82. As a result, the heat accumulated in the n-type InGaAsP cladding layer 82 and the mesa portion 92 on the cladding layer 82 causes the temperature of the mesa portion 92 including the strained quantum well active/optical waveguide layer 84 to rise. Because the width of the mesa portion 92 is as narrow as approximately 7 μm and it height is as low as 5.2 μm, its heat capacity is small. Specifically, since $K_s=70$, $K_1=10$, $d_1=3.5 \times 10^{-6}$, $w=7 \times 10^{-6}$, $h=5.2 \times 10^{-6}$, equation (I) is fulfilled.

Consequently, it is possible to change the temperature of the strained quantum well active/optical waveguide layer 84 and the oscillation wavelength greatly in a short time.

Hereinafter, the three-electrode DFB semiconductor laser device of this embodiment will be described in detail with reference to the operation of the conventional one shown in FIG. 5.

FIG. 28 shows how the temperature in the active layer changes with time, when currents flowing in the strained quantum well active/optical waveguide layers (hereinafter, referred to the active layer) 84 and 154 is increased stepwise.

Because the laser is worked into a mesa form, the current rising time under the parasitic CR limit is on the order of a nanosecond. An increase in the current causes an increase in the refractive index due to a temperature rise in the optical waveguide region, thereby causing a red shift of wavelength. Here, the main heat generating source is assumed to be the active layers 84 and 154. The change of refractive index due to a temperature rise can be considered to be instantaneous as compared with the rate of change of temperature. The rate of wavelength change due to a temperature rise in the optical waveguide region is approximately 0.1 nm/°C.

Figure 5:
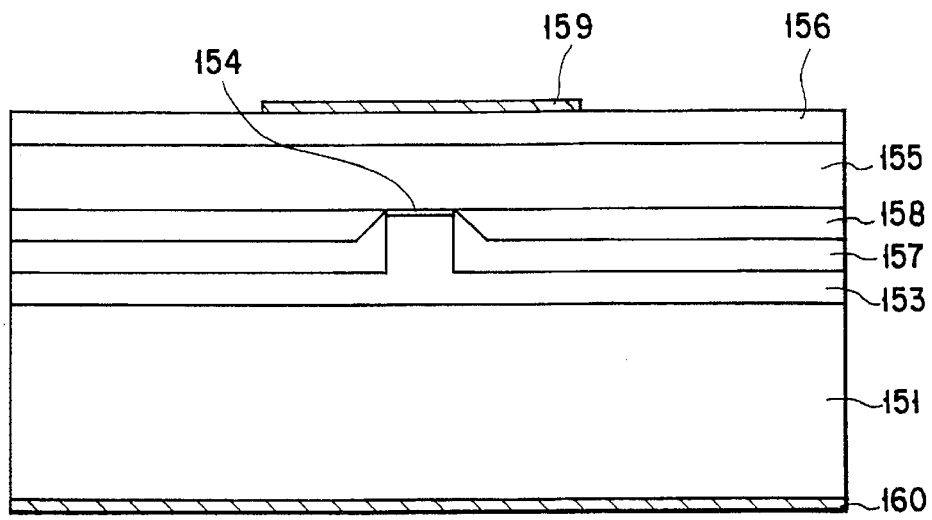
FIG. 5 is a schematic sectional view of another conventional three-electrode DFB semiconductor laser device.

In the figure, response curve a is for the conventional three-electrode DFB semiconductor laser device of FIG. 5. It can be seen that it takes 200 microseconds for the temperature to be constant and the time required for the temperature to change 90% is as long as 20 microseconds. Because of this, use of automatic frequency control (AFC) only enables control of the order of several tens of microseconds. In an optical FDM system which accesses different frequency channels every several tens of microseconds, almost half of the time spent is the dead time required for wavelength synchronization.

Response curve b is for the three-electrode semiconductor laser device of the present embodiment. It can be seen that the time needed for the temperature to reach a constant value is the same as that in the conventional one, but the temperature changes significantly in the range from 100 nanoseconds to 10 microseconds.

Specifically, although the time (several hundreds of microseconds) needed for the temperature distribution in the entire substrate to vary does no change much, it takes only several tens of microseconds for the temperature distribution only in the mesa portion 92 to be almost balanced, the mesa portion having a small heat capacity and being thermally insulated from the n-type InP substrate 81 by the n-type InGaAsP cladding layer 82. Furthermore, the time required for the temperature to change 90% is as short as 8 microseconds, enabling AFC of the order of several microseconds. Because a current change required to obtain a desired wavelength change is small, it is possible to minimize a change in the carrier density which causes a reverse wavelength change due to current injection.

Accordingly, with this embodiment, in an optical FDM system which accesses different frequency channels every several tens of microseconds, it is possible to reduce the dead time to 1/10 or less of that in the conventional one.

Response curve c is for a semiconductor laser device which has the same shape and dimensions as those of this embodiment, and which uses an n-type InP cladding layer instead of the n-type InGaAsP cladding layer 82. In this case, although temperature changes of the order of several microseconds appear, their magnitude is much lower than that in this embodiment and consequently good effects cannot be expected. In this case, since $K_1=70$, the right inequality in expression (I) is not fulfilled.

Response curve d is for the conventional three-electrode DFB semiconductor laser device of FIG. 5 with the n-type InP cladding layer 153 replaced with the same n-type InGaAsP cladding layer as that in this embodiment. In this case, although the overall temperature rise is large because of an increase in the heat resistance, no temperature change component with a time constant of the order of several microseconds appears because there is no mesa portion with a small heat capacity.

Response curve e is for the case where the thickness of the n-type InGaAsP cladding layer 82 is reduced from 3.5 μm to 1.5 μm ($d=1.5 \times 10^{-6}$). In this case, it can be seen that there are time constants of the order of several microseconds, but the effect is not so great. Specifically, to get a good effect, it is necessary to thicken the n-type InGaAsP cladding layer 82 also delaying a heat flow from the strained quantum well active/optical waveguide layer 84 into the n-type InP substrate 81, to the extent that expression (I) is fulfilled.

Response curve f is for the case where the thickness of the mesa portion 12 in this embodiment is narrowed to 4 μm ($d=1.5 \times 10^{-6}$). In this case, because the heat capacity of the mesa portion 92 decreases, the effect of the present invention is further enhanced, with the result that the time required for the temperature in the active layer to change 90% is 6 microseconds. In this way, by narrowing the width of the mesa portion 92, the n-type InGaAsP cladding layer 82 can be made much thinner according to expression (I). However, the mesa portion 92 is made higher, the time needed for the temperature of the mesa portion to change gets longer.

FIG. 29 is a schematic sectional view of a three-electrode DFB semiconductor laser device according to a sixth embodiment of the present invention. This corresponds to FIG. 25 and is a sectional view perpendicular to the stripes of the active layer. The parts corresponding to those in the three-electrode DFB semiconductor laser device of FIG. 25 are indicated by the same reference symbols as in FIG. 25. Their detailed explanation will be omitted.

In the fifth embodiment, the n-type InGaAsP cladding layer 82 serves as both a cladding layer and a heat flow delay layer. In this embodiment, however, these functions are assigned to separate semiconductor layers.

Specifically, in this embodiment, what corresponds to the n-type InGaAsP cladding layer 82 is composed of a 1.5-μm-thick n-type InGaAs mixed crystal semiconductor layer 83a (heat flow delay layer and a 1.5-μm-thick n-type InP cladding layer 83b. In addition, the n-type InGaAs mixed crystal semiconductor layer 83a is not in the mesa portion 92, but is formed on the surface of the n-type InP substrate 81. Of course, a similar effect may be obtained by providing the n-type InGaAs mixed crystal semiconductor layer 83a in the mesa portion 92. The mesa portion 92 is 4 μm wide and 3.2 μm high.

With the three-electrode DFB semiconductor laser device, because the n-type InGaAs mixed crystal semiconductor layer 83a whose thermal conductivity is lower than that of the n-type InP substrate 81 and n-type In cladding layer 83b is provided between the n-type InP substrate 81 and the n-type InP cladding layer 83b, when current is injected into the strained quantum well active/optical waveguide layer 84 and thus the strained quantum active/optical waveguide layer 84 generates heat, a heat flow from the strained quantum well active/optical waveguide layer 84 into the n-type InP substrate 81 is blocked by the n-type InGaAs mixed crystal semiconductor layer 83a.

As a result, the heat accumulated in the n-type InGaAsP mixed crystal semiconductor layer 83a and the mesa portion 92 on the mixed crystal semiconductor layer causes the temperature of the mesa portion 92 including the strained quantum well active/optical waveguide layer 84 to rise. Because the width of the mesa portion 92 is narrower and smaller than the n-type InP substrate 81, the heat capacity of the mesa portion 92 is small. Consequently, it is possible to change the temperature in the strained quantum well active/ optical waveguide layer 84 and the oscillation wavelength greatly in a short time.

A temperature response in the three-electrode DFB semiconductor laser device of the present embodiment is represented by response curve g in FIG. 28. Since the thermal conductivity of the n-type InGaAs mixed crystal semiconductor layer 83a is as low as approximately 4 W/(m·K), even a thickness of 1.5 μm provides a similar temperature response to that in response curve f (for the case where the mesa portion 92 is narrowed). The present embodiment meets expression (II).

While in this embodiment, the n-type InGaAs mixed crystal semiconductor layer 83a is used as a heat flow delay layer, another material such as metal may be used. when a metal layer is used as a heat flow delay layer, epitaxial lift-off techniques are used for its formation.

Specifically, a mesa portion is formed by epitaxial growth techniques on a semiconductor substrate different from a substrate which finally supports a laser. The mesa portion is then peeled by lift-off techniques and integrally bonded on a high thermal-conductivity substrate (e.g., Si, diamond, AlN, BN, or Cu) on whose surface a low thermal-conductivity metal layer is formed, thereby forming a characteristic structure of the present invention. Of course, a semiconductor mixed crystal layer may be formed in the mesa portion as a heat flow delay layer, which may then be integrally bonded on a high thermal-conductivity substrate or a substrate coated with a metal layer by expitaxial lift-off techniques. By using the substrate itself as a heat sink, large time-constant temperature changes can be suppressed.

While in the above embodiments, a three-electrode DFB semiconductor laser device is used, this invention may be applied to DFB semiconductor laser devices with two electrodes or four or more electrodes or to ordinary DFB semiconductor laser devices.

Instead of forming the mesa portion over the entire laser as in the above embodiments, a portion mainly acting as a gain region may be formed into a planar structure with a good thermal characteristic, and a mesa portion may be formed in only a portion mainly acting as a wavelength changing region.

Furthermore, a similar effect may be obtained by applying the invention to various structures including: a structure with a region having another function such as phase control in the resonator direction, a structure asymmetric with the resonator, a structure where separated regions differ from each other in their active layers, diffraction gratings, and cross sections, a structure without a phase shift structure, a structure with separated phase shift regions, a structure where window regions without active layers are provided at the ends, and a inclined-end structure where the emission surface is not perpendicular to the active layer stripes.

Additionally, the buried structure is not limited to that in the above embodiments. Further, the invention may be applied to what is called a photonic IC integral with other elements or a laser array.

As has been explained in detail, according to the embodiments of FIGS. 25 to 29, because the heat escaping from the active layer into the semiconductor substrate can be used to heat the active layer, it is possible to change the temperature in the active layer and the oscillation wavelength greatly in a short time.

The techniques employed in the above embodiments may be combined in any combination.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An optical transmission apparatus comprising:

a transmission system for transmitting an optical signal; and an optical reception system which contains a semiconductor laser as a local oscillation light source for reception and receives said optical signal;

wherein said semiconductor laser contains first oscillation wavelength control means for controlling its oscillation wavelength according to temperature and second oscillation wavelength control means for controlling its oscillation wavelength according to carrier density, said first oscillation wavelength control means scans the oscillation wavelength over a range from a first wavelength to a second wavelength across a plurality of channels, and said second oscillation wavelength control means simultaneously changes the scanned oscillation wavelength so as to tune the oscillation wavelength to each respective channel whenever the scanned oscillation wavelength crosses said each respective channel.

2. An optical transmission apparatus according to claim 1, wherein said optical signal is a frequency-division multiplex signal.

3. An optical transmission apparatus according to claim 1, wherein said first oscillation wavelength control means is current control means for controlling the injection of current into an active waveguide region in said semiconductor laser.

4. An optical transmission apparatus according to claim 1, wherein said first oscillation wavelength control means is heating means built in said semiconductor laser.

5. An optical transmission apparatus according to claim 1, wherein said second oscillation wavelength control means is current control means for controlling the injection of current into a passive waveguide region in said semiconductor laser.

6. An optical transmission apparatus according to claim 1, wherein wavelengths are scanned and selected one after another, starting at said first wavelength and ending at said second wavelength, and thereafter are scanned backward and selected one after another, starting at said second wavelength and ending at said first wavelength.

7. A semiconductor laser device comprising:

a striped optical waveguide structure composed of an active layer acting as a light-emitting layer, a diffraction grating acting as feedback means of a laser resonator provided in a waveguide of the laser light generated in the active layer, and a first barrier layer for adding sufficient energy to the carriers injected into said active layer to cause a voltage drop of 0.3 to 1.0 volts;

a first and second cladding layer for sandwiching the optical waveguide structure; and a plurality of current injection regions arranged in the direction in which said laser light travels.

8. A semiconductor laser device according to claim 7, wherein said active layer has a strained quantum well structure comprising a well layer made of InGaAs(P), and said first barrier layer is made of In(Ga)AlAs.

9. A semiconductor laser device according to claim 7, further comprising an automatic frequency control circuit for dividing a laser output, detecting an oscillation wavelength error signal from said divided part of said laser output, and feeding back said detected error signal to current injected into said laser device, said automatic frequency control circuit starting an operation after wavelength tuning operation of laser starts.

10. A semiconductor laser device according to claim 7, wherein said first barrier layer is provided between said active layer and said first cladding layer, and a second barrier layer for preventing carrier overflow from said active layer is provided between said active layer and said second cladding layer.

11. A semiconductor laser device comprising:

a substrate;

a first cladding layer in a projected shape provided on the substrate whose thermal conductivity is lower than that of the substrate;

an active layer formed on the projected portion of the first cladding layer and acting as both a light-emitting layer and an optical waveguide layer;

means for injecting current into said active layer;

a second cladding layer provided on the active layer and, together with said first cladding layer, sandwiching said active layer; and a diffraction grating provided in a waveguide of the laser light generated in said active layer and acting as a distributed feedback resonator;

wherein, when a thermal conductivity of the substrate is $K_s$ (w/(m·K)), a thermal conductivity of the first cladding layer is $K_1$ (W/(m·K)), a thickness of the first cladding layer is $d_1$ (m), a width of the second cladding layer is w (m), and a height of a part above the first clad layer is h (m), the following inequality is satisfied:

$$C \cdot h < K_1/d_1 < K_s/(2w) \qquad (I)$$

where $C=1.5 \times 10^{11}$ (W/m³K).

12. A semiconductor laser device according to claim 11, wherein said substrate is made of a binary semiconductor crystal, said first cladding layer is made of a semiconductor crystal with three or more components, and said second cladding layer is made of binary semiconductor crystal.

13. A semiconductor laser device according to claim 11, wherein said substrate is made of InP, and said first cladding layer is made of InGaAsP.

14. A semiconductor laser device comprising:

a substrate;

a heat flow delay layer provided on the substrate whose thermal conductivity is lower than that of the substrate;

a first cladding layer provided on the heat flow delay layer which has a higher thermal conductivity than the heat flow delay layer and a narrower width than the substrate;

an active layer formed on the first cladding layer and acting as both a light-emitting layer and an optical waveguide layer;

a second cladding layer provided on the active layer and, together with said first cladding layer, sandwiching said active layer; and a diffraction grating provided in a waveguide of the laser light generated in said active layer and acting as a distributed feedback resonator.

15. A semiconductor laser device according to claim 14, wherein said substrate and said first cladding layer are made of a binary semiconductor crystal, and said heat flow delay layer is made of a semiconductor crystal with three or more components.

16. A semiconductor laser device according to claim 14, wherein said substrate and first cladding layer are made of InP, and said heat flow delay layer is made of InGaAs(P).

17. A semiconductor laser device according to claim 14, wherein said first cladding layer is made of binary semiconductor crystal, and said heat flow delay layer is made of metal.

18. A semiconductor laser device according to claim 14, wherein, when a thermal conductivity of the substrate $K_s$ (w/(m·K)), a thermal conductivity of the first cladding layer is $K_1$ (W/(m·K)), a thickness of the first cladding layer is $d_1$ (m), a width of the second cladding layer is w (m), and a height of a part above the first clad layer is h (m), the following inequality is satisfied:

$$C \cdot h < K_1/d_1 < K_s/(2w) \qquad (I)$$

where $C=1.5 \times 10^{11}$ (W/m³K).

* * * * *